(12) United States Patent
Unokuchi

(10) Patent No.: US 10,001,510 B2
(45) Date of Patent: Jun. 19, 2018

(54) METHOD OF MANUFACTURING SEMICONDUCTOR DEVICE

(71) Applicant: Renesas Electronics Corporation, Koutou-ku, Tokyo (JP)

(72) Inventor: Fukumi Unokuchi, Gunma (JP)

(73) Assignee: Renesas Electronics Corporation, Tokyo (JP)

( * ) Notice: Subject to any disclaimer, the term of this patent is extended or adjusted under 35 U.S.C. 154(b) by 75 days.

(21) Appl. No.: 15/294,781

(22) Filed: Oct. 16, 2016

(65) Prior Publication Data
US 2017/0160311 A1    Jun. 8, 2017

(30) Foreign Application Priority Data
Dec. 4, 2015 (JP) ................. 2015-237182

(51) Int. Cl.
| | | |
|---|---|---|
| G01R 1/067 | (2006.01) | |
| G01R 31/00 | (2006.01) | |
| G01R 3/00 | (2006.01) | |
| H01L 21/66 | (2006.01) | |
| G01R 1/073 | (2006.01) | |
| G01R 1/04 | (2006.01) | |

(52) U.S. Cl.
CPC .............. G01R 3/00 (2013.01); G01R 1/0466 (2013.01); G01R 1/067 (2013.01); G01R 1/06716 (2013.01); G01R 1/07314 (2013.01); H01L 22/14 (2013.01); G01R 1/06722 (2013.01)

(58) Field of Classification Search
CPC .............. G01R 1/067; G01R 1/06716; G01R 1/06722; G01R 1/07314; G01R 1/07342; G01R 31/2891

USPC ......... 324/71, 378, 403, 415, 425, 500, 537, 324/755.01, 755.04, 755.05
See application file for complete search history.

(56) References Cited

U.S. PATENT DOCUMENTS

| | | | |
|---|---|---|---|
| 2003/0124895 A1* | 7/2003 | Winter ................ | G01R 1/0466 439/219 |
| 2008/0180125 A1* | 7/2008 | Lee .................... | G01R 1/06733 324/755.05 |
| 2015/0369859 A1* | 12/2015 | Suzuki ............... | G01R 1/06722 324/755.08 |

FOREIGN PATENT DOCUMENTS

JP    2006-343113 A    12/2006

* cited by examiner

Primary Examiner — Jermele M Hollington
Assistant Examiner — Raul Rios Russo
(74) Attorney, Agent, or Firm — Shapiro, Gabor and Rosenberger, PLLC

(57) ABSTRACT

Electrical properties of a semiconductor device are reproducibly and stably measured in a testing step of the semiconductor device. A probe pin includes a first plunger, a second plunger, a cleaning shaft, a first coil spring, and a second coil spring. The cleaning shaft accommodated in the inside of the first plunger is allowed to enter and exit through a tip of a contact of the first plunger by the second coil spring, thereby solder shavings attached to the tip of the contact are removed. The first plunger is electrically coupled to the second plunger by the first coil spring wound on an outer side face of the first plunger and on an outer side face of the second plunger.

15 Claims, 23 Drawing Sheets

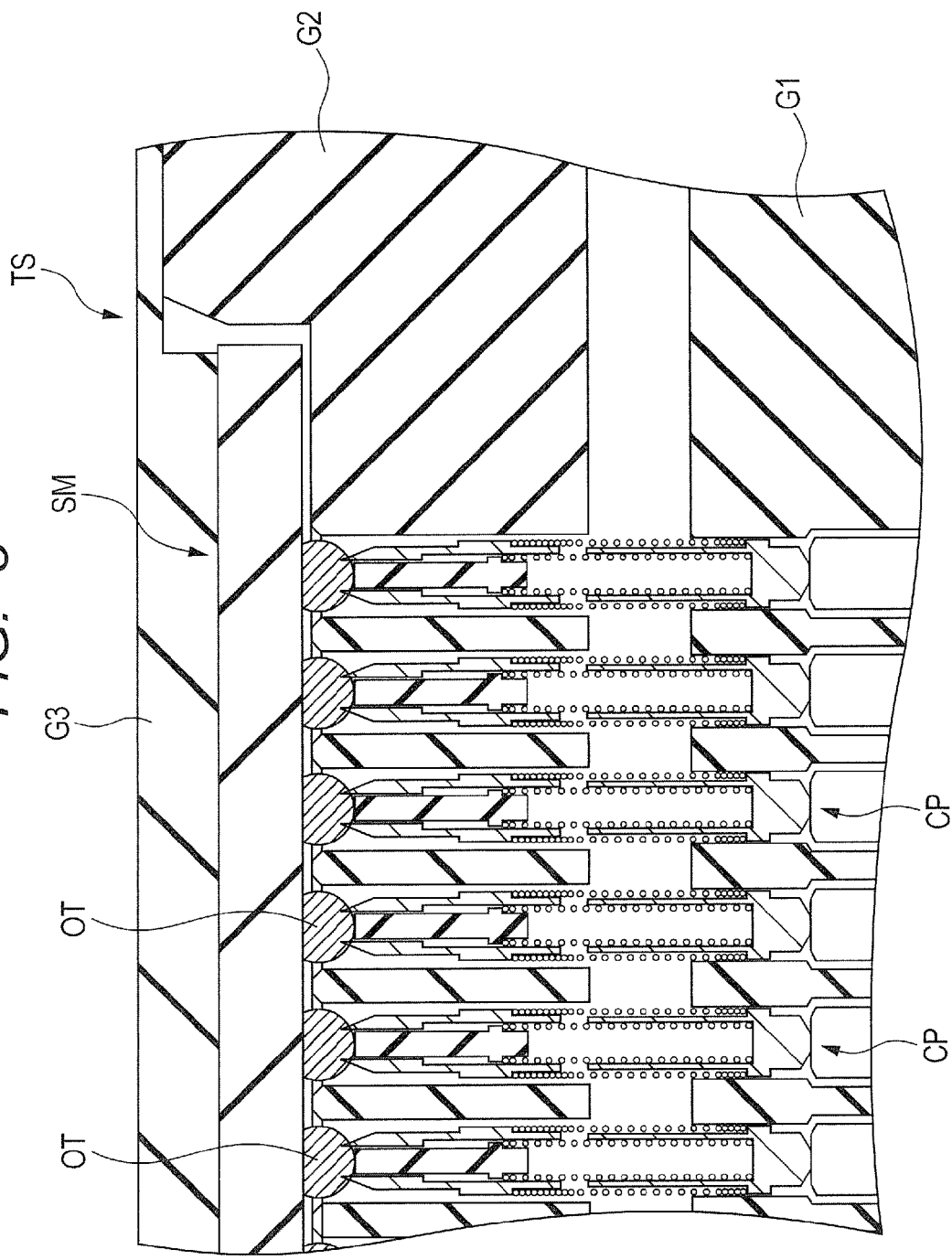

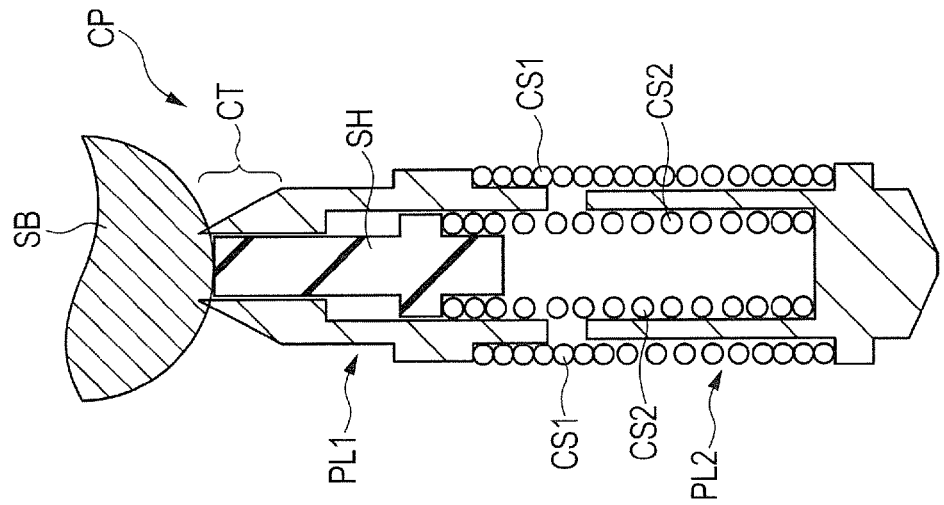
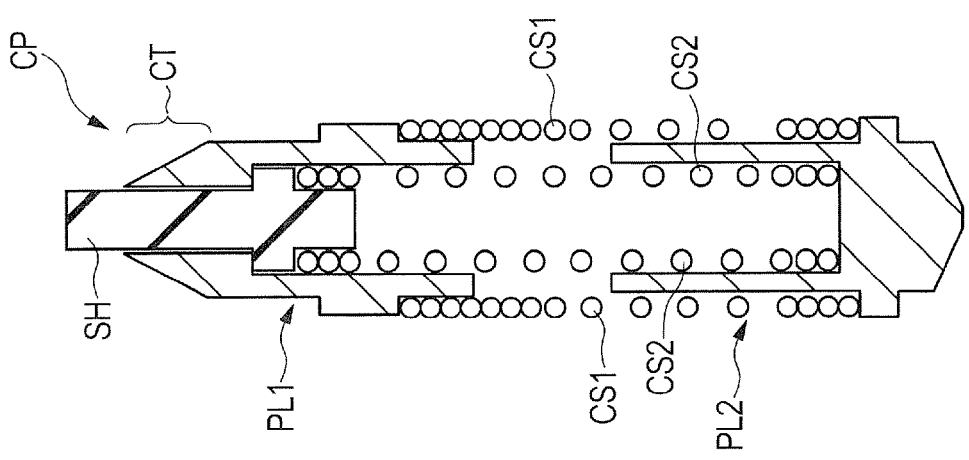
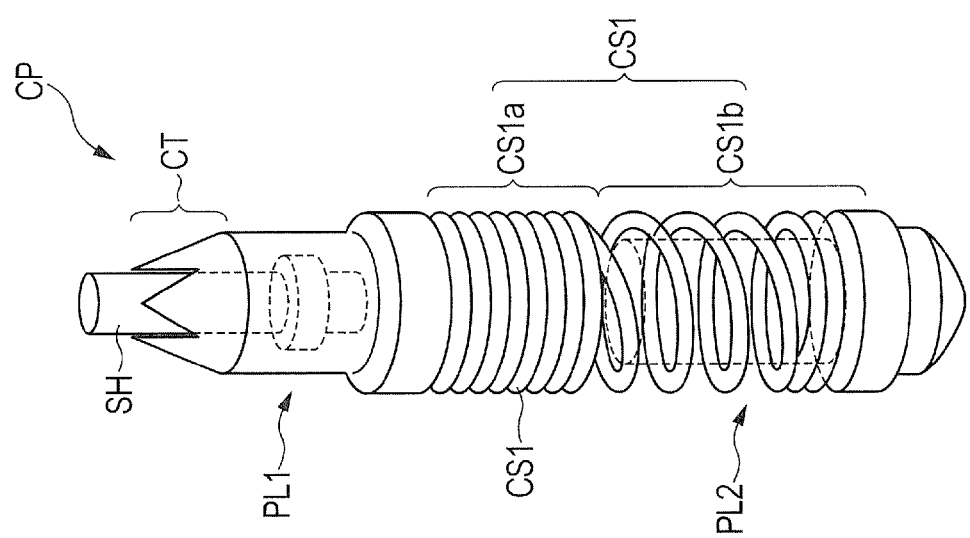

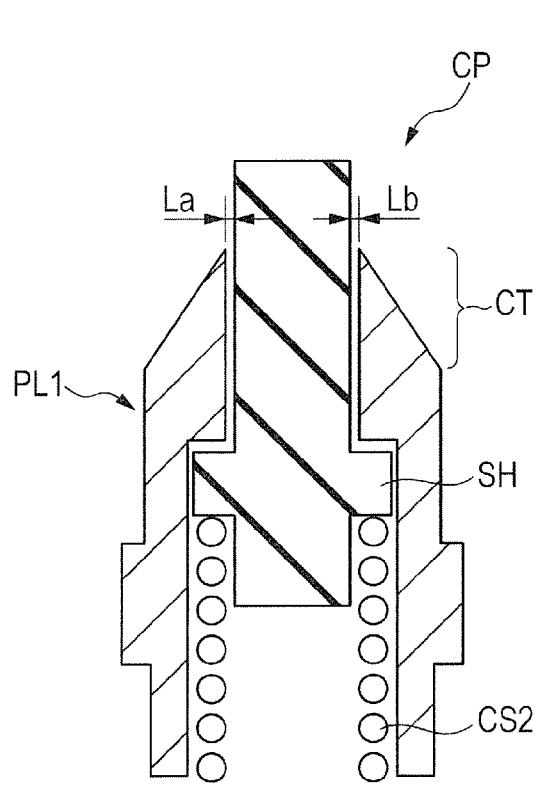
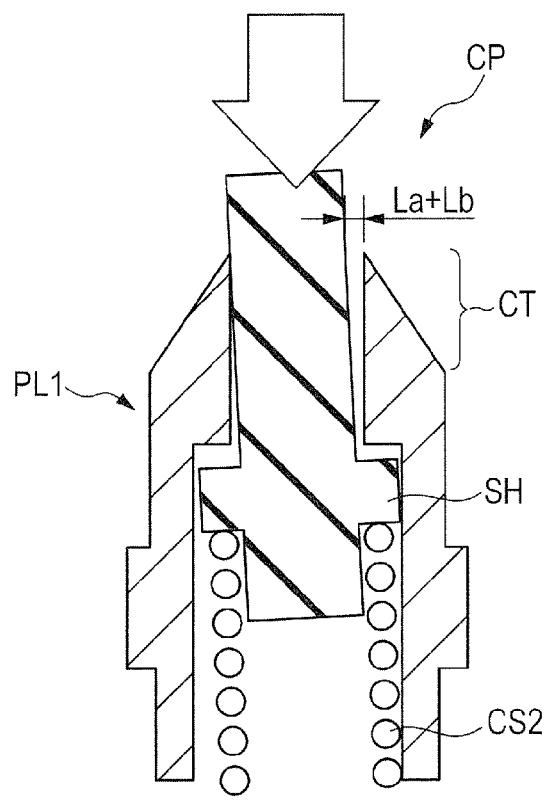
FIG. 8A  FIG. 8B
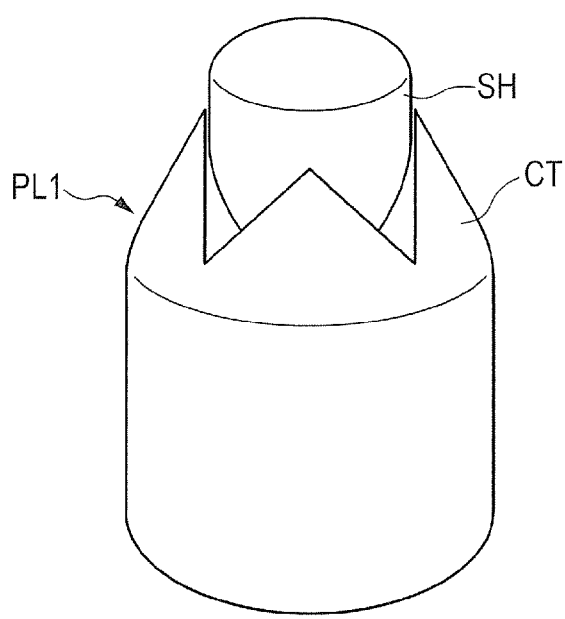
FIG. 9

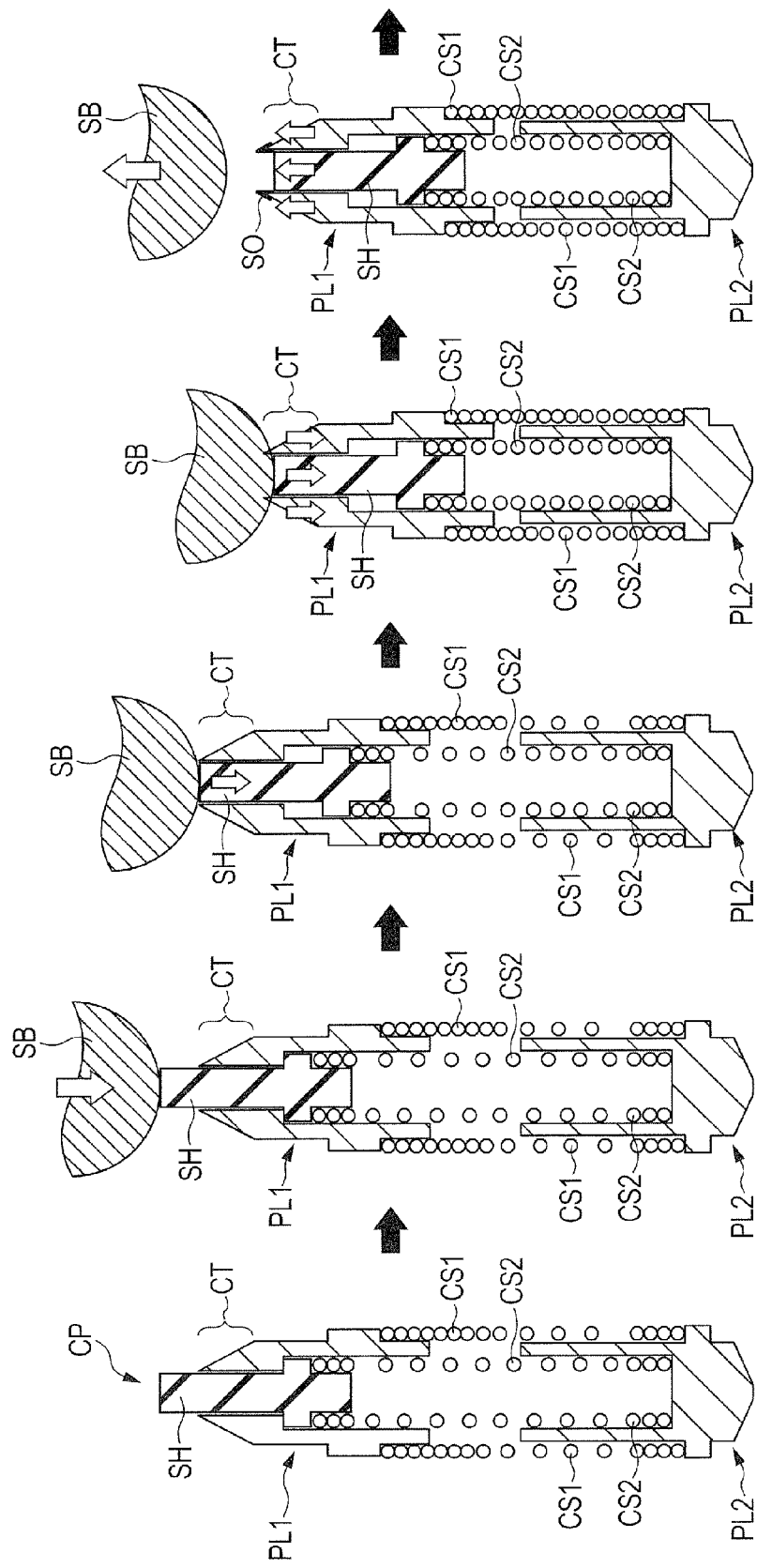

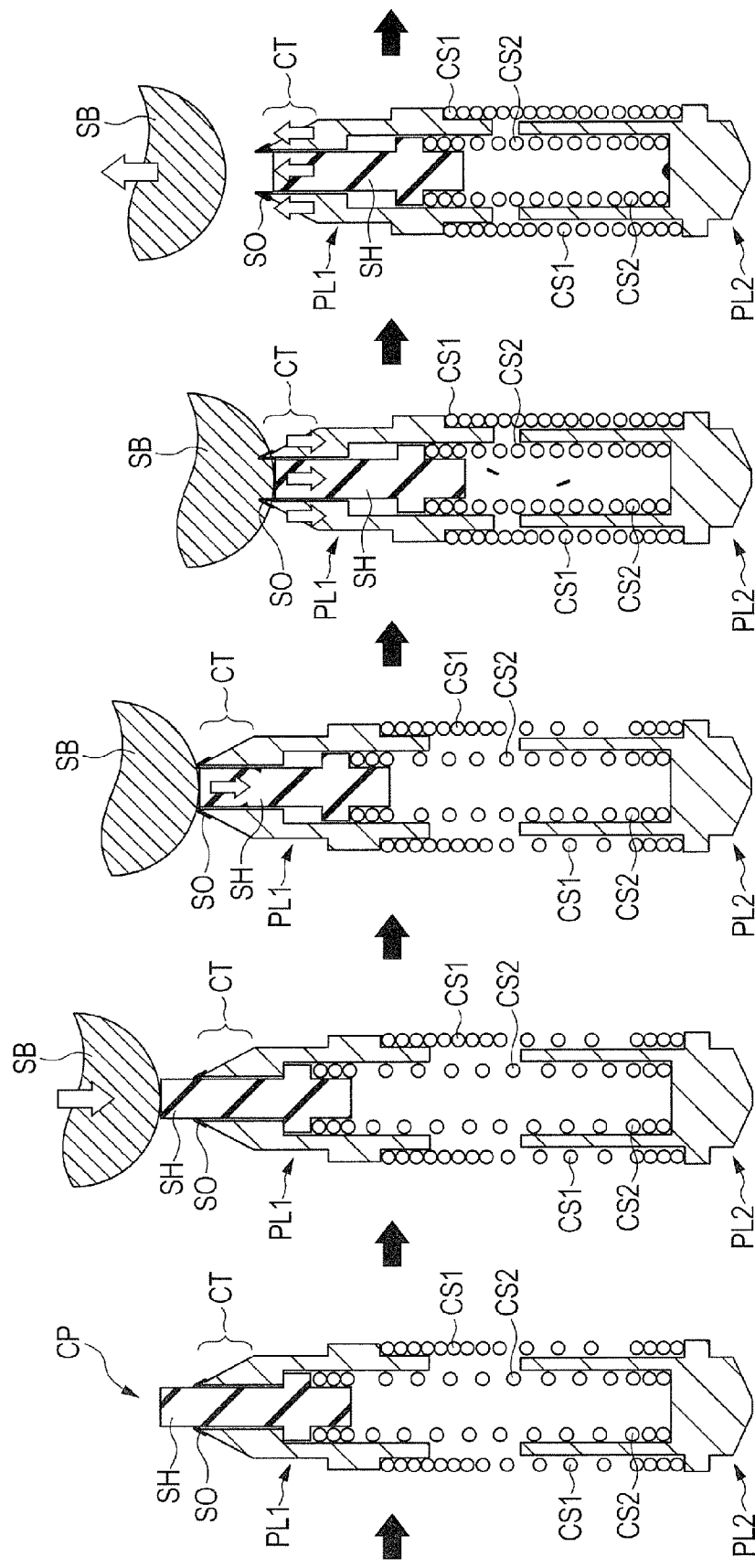

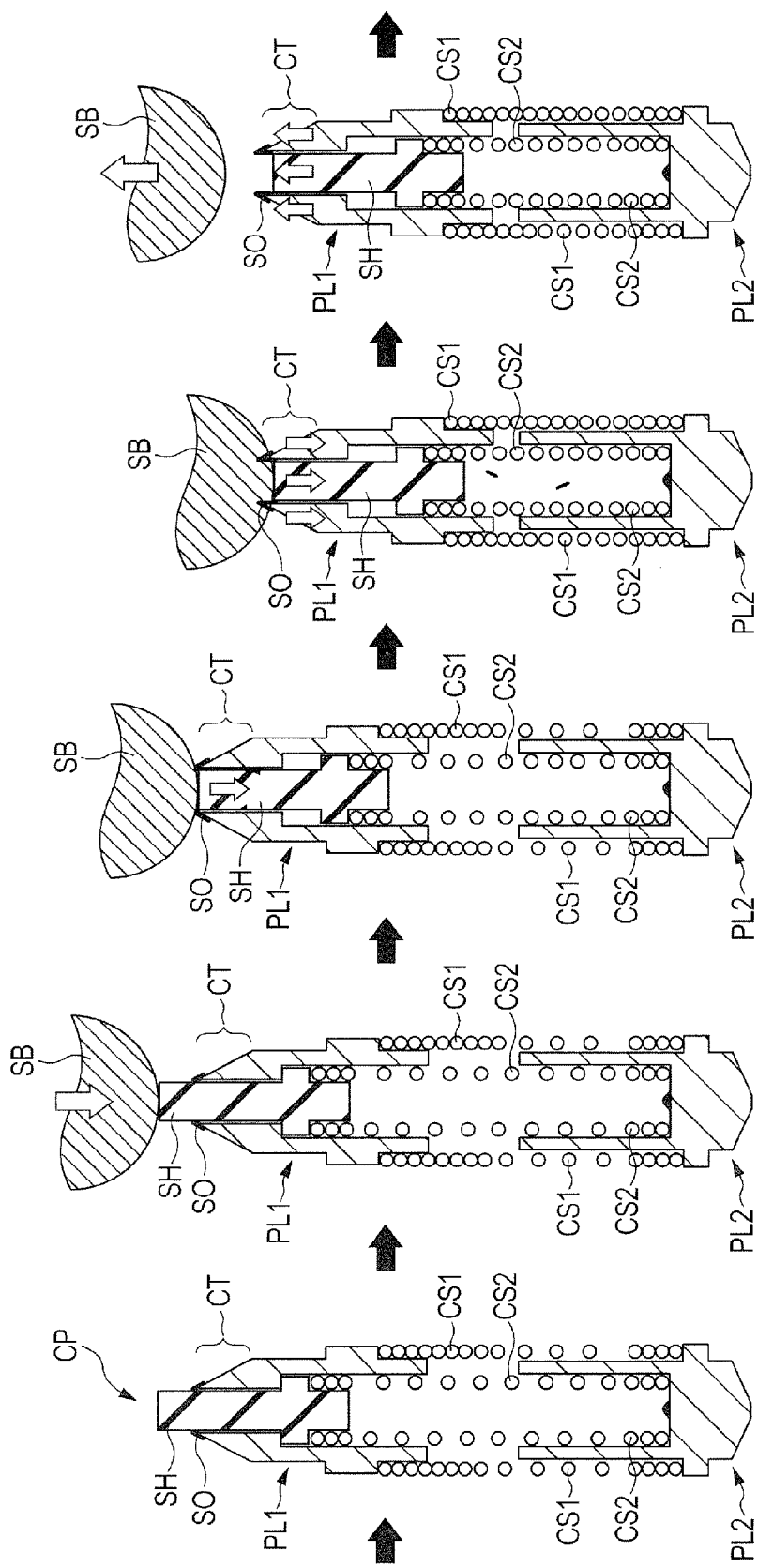

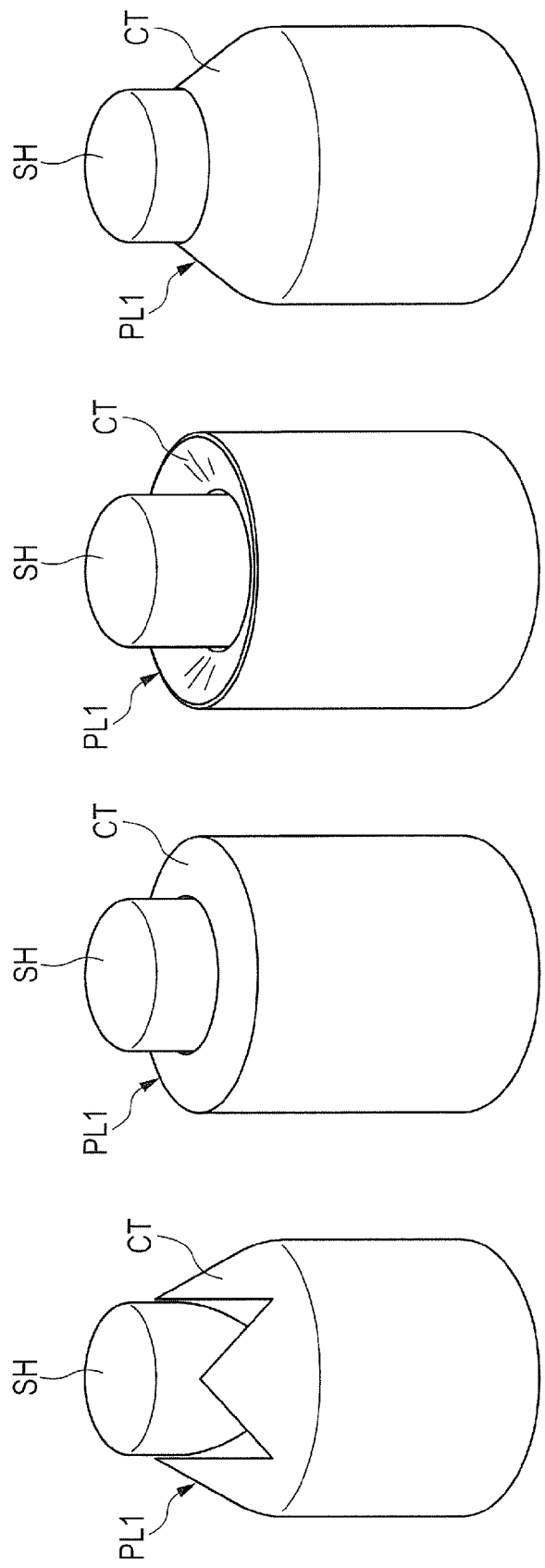

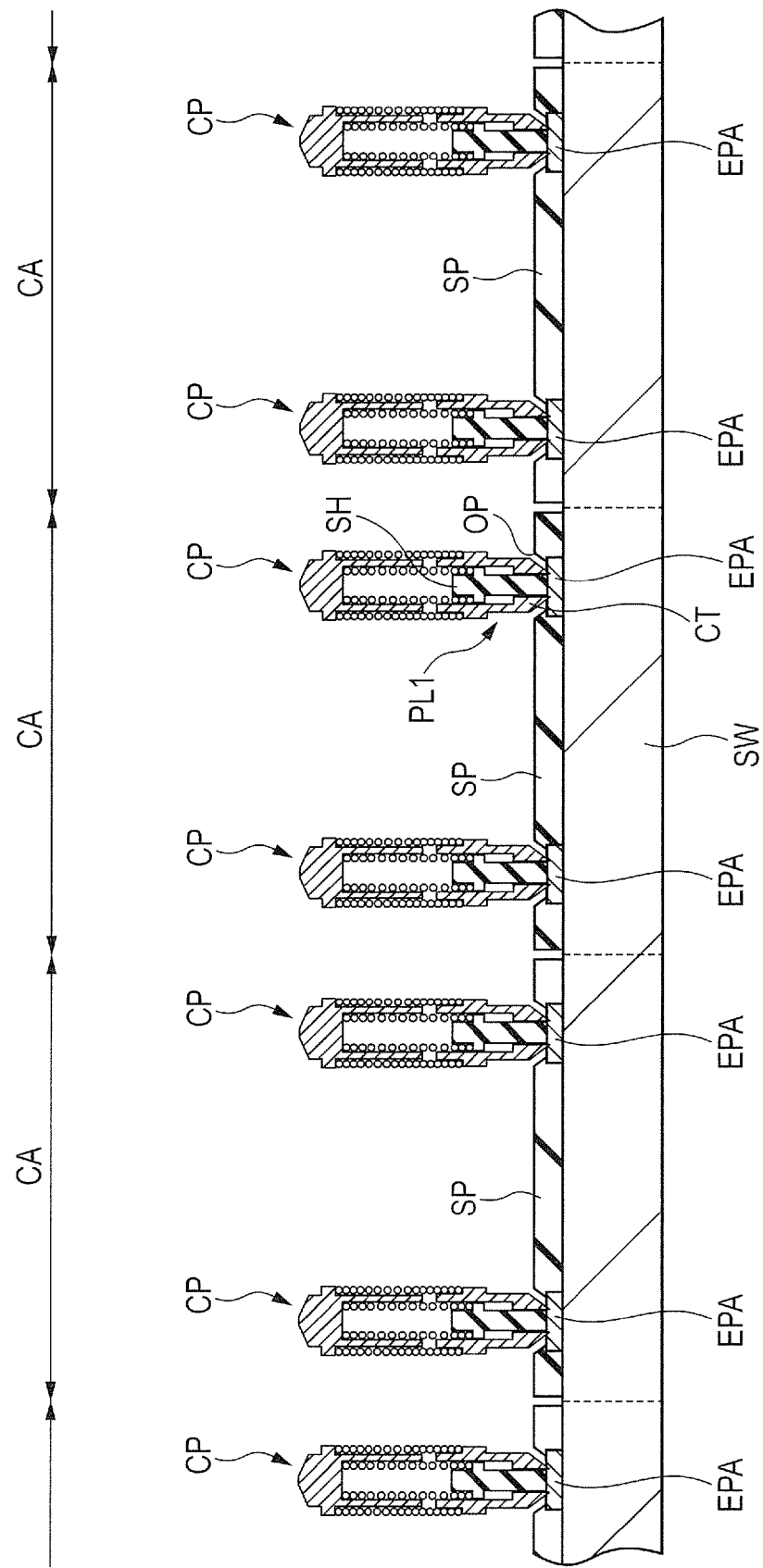

METHOD OF MANUFACTURING SEMICONDUCTOR DEVICE

CROSS-REFERENCE TO RELATED APPLICATIONS

The disclosure of Japanese Patent Application No. 2015-237182 filed on Dec. 4, 2015 including the specification, drawings and abstract is incorporated herein by reference in its entirety.

BACKGROUND

The present invention relates to a technique for manufacturing a semiconductor device, which is preferably used for semiconductor device manufacture including a step of testing electrical characteristics of a semiconductor integrated circuit (IC) using an IC test socket having a plurality of probe pins or a probe card having a plurality of probe pins.

Japanese Unexamined Patent Application Publication No. 2006-343113 describes a semiconductor tester having a rotation mechanism that rotates a probe pin being pressed to a terminal. The rotation mechanism includes a spiral protrusion provided on a side face of the probe pin, a spiral groove that is provided on an inner side face of a housing and fitted with the protrusion, and a spring component that is attached to a rear end of the probe pin and biases the probe pin in a direction in which the probe pin is pushed out from the housing.

SUMMARY

In a sorting step of a semiconductor device, when electrical properties of the semiconductor device are tested, a probe pin having a contact, which is coated with a highly conductive and hard plating film, is generally used as a tool for improving contact performance. However, when the probe pin is repeatedly brought into contact with an outer terminal provided on the semiconductor device, shavings of a metal configuring the outer terminal adhere to a tip of the contact, causing a variation in contact resistance and bad contact.

In the existing technique, operation of a tester is stopped, and the tip of the contact is cleaned using a metal brush or a cleaning sheet, and thus the metal shavings attached to the tip of the contact are regularly removed. This method, however, reduces operation efficiency of the tester and requires much time and effort because tester operation is stopped.

Other issues and novel features will be clarified from the description of this specification and the accompanying drawings.

According to one embodiment, a probe pin, which includes a first plunger, a second plunger, a cleaning shaft, a first coil spring, and a second coil spring, is brought into contact with an outer terminal of a semiconductor device to test electrical properties of the semiconductor device. The first plunger is a hollow structure that configures an upper part of the probe pin, and has a contact that comes into contact with the outer terminal. The second plunger is a hollow structure that configures a lower part of the probe pin separately from the first plunger, and has a bottom at an end on a side opposite to the first plunger. The cleaning shaft is accommodated in the inside of the first plunger, and partially projects from a tip of the contact. The first coil spring is wound on an outer side face of the first plunger and on an outer side face of the second plunger, and electrically couples the first plunger to the second plunger. The second coil spring is accommodated in the inside of the first plunger and in the inside of the second plunger while being held between the cleaning shaft and the bottom of the second plunger. Part of the cleaning shaft enters and exits through the tip of the contact, thereby metal shavings attached to the tip of the contact are removed.

According to the embodiment, electrical properties of a semiconductor device can be reproducibly and stably measured in a testing step of the semiconductor device.

BRIEF DESCRIPTION OF THE DRAWINGS

FIG. 3 is a sectional view illustrating part of the IC test socket, which has the semiconductor device of the embodiment inserted therein, in an enlarged manner.

FIGS. 4A, 4B, and 4C show the probe pin of the embodiment, where FIG. 4A is a schematic view of the probe pin that is not in contact with the outer terminal, FIG. 4B is a sectional view of the probe pin that is not in contact with the external terminal, and FIG. 4C is a sectional view of the probe pin in contact with the outer terminal.

FIG. 5A is a sectional view of the first plunger in contact with the outer terminal in an enlarged manner, and FIG. 5B is a sectional view of the first plunger after the first plunger has been in contact with the outer terminal in an enlarged manner.

FIGS. 8A and 8B are each a sectional view of part of the probe pin to explain a space between the first plunger and a cleaning shaft of the embodiment, where FIG. 8A is a sectional view illustrating part of the probe pin, which is not in contact with the outer terminal, in an enlarged manner, and FIG. 8B is a sectional view illustrating part of the probe pin in contact with the outer terminal in an enlarged manner.

FIG. 9 is a perspective view illustrating part of the probe pin to explain a material of each of the first plunger and the cleaning shaft of the embodiment.

FIG. 10A is a sectional view illustrating part of the probe pin that is not in contact with the outer terminal in an enlarged manner, and FIG. 10B is a sectional view illustrating part of the probe pin in contact with the outer terminal in an enlarged manner.

FIGS. 12A, 12B, 12C, 12D, and 12E are sectional views explaining the sequential operation of the probe pin of the embodiment.

FIGS. 13A, 13B, 13C, 13D, and 13E are sectional views explaining the sequential operation of the probe pin of the embodiment.

FIG. 14A is a sectional view illustrating the tip of the contact, to which solder shavings are attached, in an enlarged manner, and FIG. 14B is a sectional view illustrating the tip of the contact, from which some of the solder shavings has been removed, in an enlarged manner.

FIGS. 15A, 15B, 15C, 15D, and 15E are sectional views of the probe pin of the embodiment to explain sequential operation of the probe pin.

FIG. 16A is a sectional view illustrating the tip of the contact, to which solder shavings are attached, in an enlarged manner, and FIG. 16B is a sectional view illustrating the tip of the contact, from which some of the solder shavings has been removed, in an enlarged manner.

FIGS. 19A, 19B, 19C, and 19D are perspective views illustrating various shapes of the contact of the first plunger of the embodiment.

FIG. 20A is a schematic view illustrating the semiconductor device as a whole, and FIG. 20B is a sectional view illustrating part of each of an outer terminal and a probe pin in an enlarged manner.

FIG. 21A is a schematic view illustrating the semiconductor device as a whole, and FIG. 21B is a sectional view illustrating part of each of the outer terminal and the probe pin in an enlarged manner.

FIG. 22A is a schematic view illustrating the semiconductor device as a whole, and FIG. 22B is a sectional view illustrating part of each of the outer terminal and the probe pin in an enlarged manner.

FIG. 23 is a sectional view to explain a probe pin provided in a probe card of a modification of the embodiment.

DETAILED DESCRIPTION

Although the following embodiment may be dividedly described in a plurality of sections or embodiments for convenience as necessary, they are not unrelated to one another except for the particularly defined case, and are in a relationship where one is a modification, detailed explanation, supplementary explanation, or the like of part or all of another one.

In the following embodiment, when the number of elements (including the number, a numerical value, amount, and a range) is mentioned, the number is not limited to a specified number except for the particularly defined case and for the case where the number is principally clearly limited to the specified number. In other words, the number may be not less than or not more than the specified number.

In the following embodiment, it will be appreciated that a constitutional element (including an element step) of the embodiment is not necessarily indispensable except for the particularly defined case and for the case where the constitutional element is probably indispensable in principle.

It will be appreciated that the term "comprised of A", "configured of A", "having A", or "including A" is not intended to exclude any element other than the element A except for the case where the element A is particularly defined to be exclusive, for example. Similarly, in the following embodiment, when a shape of a constitutional element, a positional relationship, and the like are described, any configuration substantially closely related to or similar to such a shape or the like should be included except for the particularly defined case and for the case where the configuration is probably not included in principle. The same holds true in each of the numerical value and the range.

In drawings used in the following embodiment, a particular site may be illustrated to be relatively large for better viewability, and a sectional view may not be hatched for better viewability. In all drawings for explaining the following embodiment, components having the same function are designated by the same numeral, and duplicated description is omitted.

Hereinafter, one embodiment of the invention is described in detail according to the accompanying drawings.

Detailed Description of Problem to be Solved

Figure 24A:
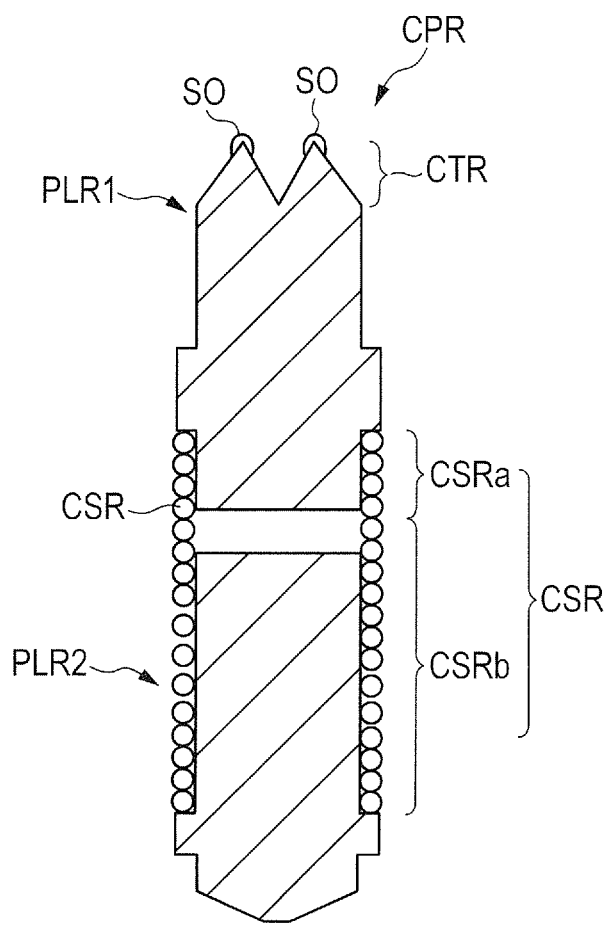
FIG. 24A is a sectional view of a previous probe pin to which the embodiment is not applied.
Figure 24B:
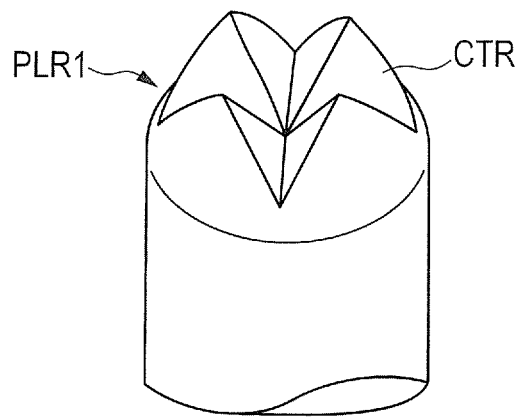
FIG. 24B is a perspective view illustrating an end portion of the probe pin in an enlarged manner.

The inventors have investigated a structure and a problem of a previous probe pin to which this embodiment is not applied, which probably more clarify a structure of a probe of this embodiment. The structure and the problem are described below using FIGS. 24A and 24B. FIG. 24A is a sectional view of the previous probe pin to which this embodiment is not applied. FIG. 24B is a perspective view illustrating a tip portion of the previous probe pin, to which this embodiment is not applied, in an enlarged manner In a sorting step after assembly of a semiconductor device, electrical testing of the semiconductor device is performed using an IC test socket having a plurality of probe pins, for example. For example, for a ball grid array (BGA)-type semiconductor device (semiconductor package), the semiconductor device is inserted into an IC test socket, and a plurality of probe pins are brought into contact with a plurality of solder bumps as outer terminals. In such a state, a predetermined electric signal is transmitted from a tester to the probe pins to perform electrical testing.

As illustrated in FIG. 24A, a probe pin (contact pin, contact probe, probe) CPR is a movable probe pin having a tip that expands and contracts by a spring. The probe pin CPR includes a first plunger PLR1 having a contact CTR that pierces into a solder bump, a second plunger PLR2 having a functional integrity with the first plunger PLR1, and a coil spring CSR serving as a relay between the first plunger PLR1 and the second plunger PLR2. The coil spring CSR includes a stationary portion CSRa including a coil that is fixedly and closely wound on an outer side face of the first plunger PLR1, and a stretchable portion CSRb including a coil that is wound on an outer side face of the second plunger PLR2 in a stretchable manner.

As illustrated in FIG. 24B, a tip of the contact CTR of the first plunger PLR1 has a split shape to improve contact performance, and each apex of the split shape has an acute angle.

However, such a probe pin CPR has the following technical problems.

The probe pin CPR having such a structure has a small area (number of points) of true contact points of the tip of the contact CTR that pierces into a solder bump. Hence, when contact of the probe pin CPR to the solder bump is repeated several times, the area of the true contact points varies due to adhesion of solder shavings SO to the tip of the contact CTR.

The main component of the solder bump is tin (Sn), and tin (Sn) attached to the tip of the contact CTR is easily oxidized and formed into SnO or $SnO_2$ (tin oxide). As a result, the solder shavings SO attached to the tip of the contact CTR become an insulator, leading to an increase in contact resistance.

In addition, a tip surface of the contact CTR must be cleaned using, for example, a metal brush or a polishing sheet after repeating contact of the probe pin CPR to the solder bump in order to remove the solder shavings SO attached to the tip of the contact CTR. However, tester operation must be stopped to clean the probe pin CPR, and thus operation efficiency of the tester is reduced, and much time and effort are taken.

In this way, when the number of times of contact of the probe pin CPR to the solder bump increases, contact resistance during testing greatly varies. In particular, a high-speed waveform transmission test or a test requiring large-current application has not been able to be performed while electrical properties of a semiconductor device are measured reproducibly and stably.

Embodiment

Description is now given on electrical testing of a semiconductor device of an embodiment of the invention, the electrical testing being performed in a sorting step after assembly of the semiconductor device, and on a probe pin provided in an IC test socket used in such electrical testing.

Semiconductor Device

Figure 1:
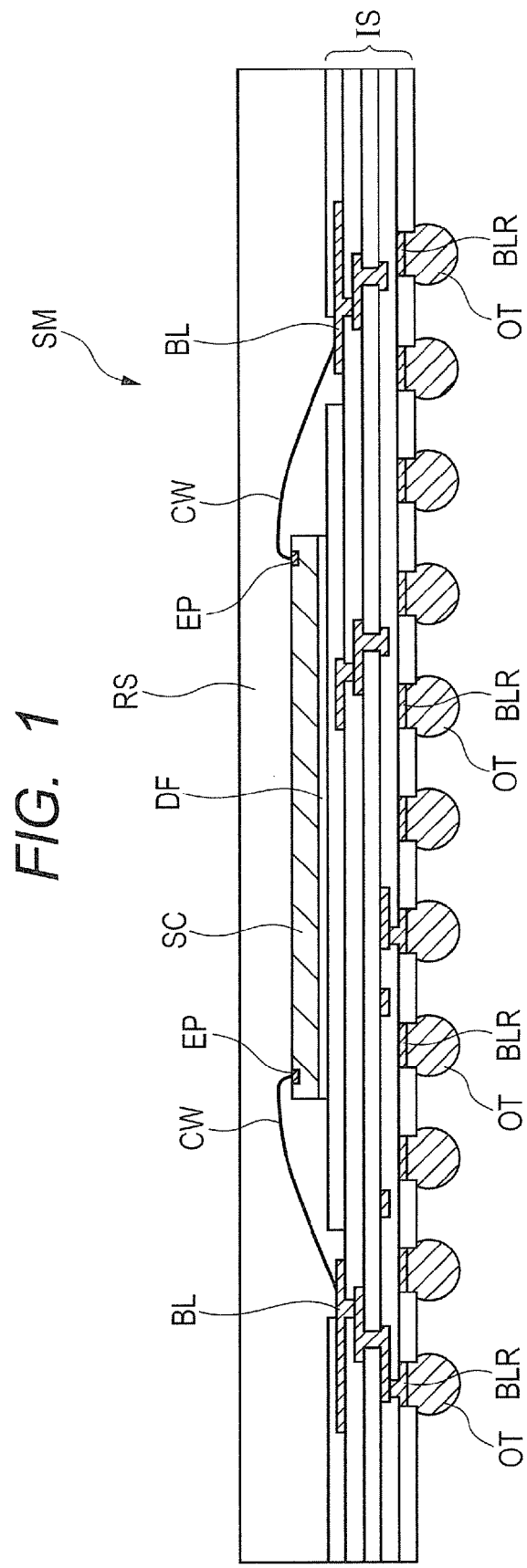
FIG. 1 is a major-part sectional view of a semiconductor device of one embodiment.

A BGA-type semiconductor device (semiconductor package) having a face-up bonding structure using wire bonding connection illustrated in FIG. 1 is described as an example of the semiconductor device. FIG. 1 is a major-part sectional view of a semiconductor device of this embodiment.

As illustrated in FIG. 1, a semiconductor device SM has, but is not limited to, a package structure in which a semiconductor chip SC is mounted on an upper surface of an interconnection substrate IS, and a plurality of ball-shaped outer terminals OT are disposed as external connection terminals on a lower surface (surface on a side opposite to the upper surface of the interconnection substrate IS) of the interconnection substrate IS.

(1) Semiconductor Chip

The semiconductor chip SC has a main surface and a back surface on a side opposite to the main surface, and is mounted in a chip mount region in the middle of the upper surface of the interconnection substrate IS with a paste adhesive or a film adhesive DF such as a die attach film (DAF) such that the back surface of the semiconductor chip SC is opposed to the upper surface of the interconnection substrate IS.

A plurality of bonding pads (electrode pads) EP, which are each electrically coupled to a semiconductor element, are disposed on the main surface of the semiconductor chip SC. The bonding pads EP each include an interconnection in an uppermost layer of a multilayered interconnection layer of the semiconductor chip SC, and part of an upper surface of each bonding pad EP is exposed from an opening provided in a surface protective film in correspondence to the bonding pad EP.

(2) Interconnection Substrate

The interconnection substrate IS is a, for example, build-up substrate, and has a rectangular, planar shape intersecting with a thickness direction thereof. The interconnection substrate IS has, but is not limited to, a multilayered interconnection structure that mainly includes a core component (base component), and interconnections on a first surface (upper surface) side, on a second surface (lower surface) side, and in the inside of the core component.

A plurality of bonding leads (electrode pads) BL are disposed along each side of the interconnection substrate IS in a region around the chip mount region on the upper surface of the interconnection substrate IS. Each of such bonding leads BL includes an interconnection in an uppermost layer provided in the interconnection substrate IS, and an upper surface of the bonding lead BL is exposed from an opening provided in an upper protective film.

A plurality of bump lands (electrode pads) BLR are disposed on the lower surface of the interconnection substrate IS. Each of such bump lands BLR includes an interconnection in a lowermost layer provided in the interconnection substrate IS, and a lower surface of the bump land BLR is exposed from an opening provided in a lower protective film.

(3) Conductive Component

The respective bonding pads EP disposed on the surface of the semiconductor chip SC are electrically coupled to the bonding leads BL disposed on the upper surface of the interconnection substrate IS via a plurality of conductive wires (bonding wires, wires) CW. For example, a gold (Au) wire or a copper (Cu) wire about 15 to 50 μm in diameter is used as the conductive wire CW.

(4) Sealant

The semiconductor chip SC and the conductive wires CW are sealed by a sealant RS provided on the upper surface of the interconnection substrate IS. The sealant RS is formed of an epoxy-series thermosetting insulating resin, which contains, for example, a phenol curing agent, silicone rubber, and a large number of fillers (for example, silica) in order to achieve low stress. The sealant RS is formed by a transfer mold process, for example.

(5) Outer Terminal

The outer terminals OT are provided on the bump lands BLR provided on the lower surface of the interconnection substrate IS. The respective outer terminals OT are electrically and mechanically coupled to the bump lands BLR. A solder bump having a lead-free solder composition containing substantially no lead, for example, a solder bump having a composition of Sn—3 wt % Ag—0.5 wt % Cu (tin—3 wt % silver—0.5 wt % copper) is used as the outer terminal OT.

IC Test Socket

Figure 2:
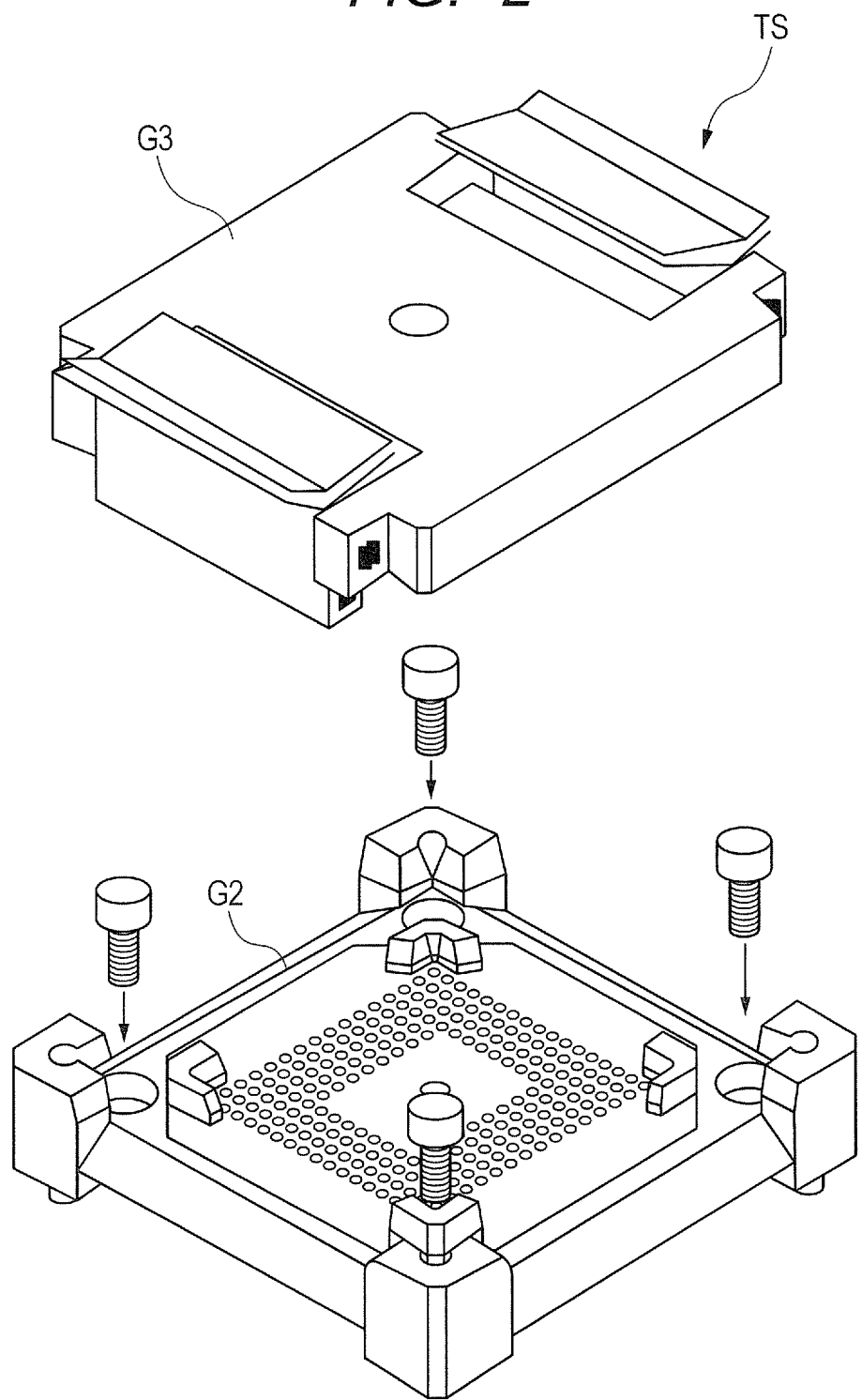
FIG. 2 is a schematic perspective view of an IC test socket of the embodiment.

The IC test socket of this embodiment is described with FIGS. 2 and 3. FIG. 2 is a schematic perspective view of the IC test socket of this embodiment. FIG. 3 is a major-part sectional view illustrating part of the IC test socket, which has the semiconductor device of this embodiment inserted therein, in an enlarged manner.

As illustrated in FIGS. 2 and 3, the IC test socket TS includes a plurality of probe pins (contact pins, contact probes, probes) CP that are each brought into contact with each of the outer terminals OT of the semiconductor device SM during testing, and a socket base (probe guide) G1 fixing the probe pins CP. The IC test socket TS further includes a floating base (package guide) G2 that can accommodate the semiconductor device SM, and a package press cover G3 that presses the semiconductor device SM mounted in the floating base G2. The semiconductor device SM is mounted in the floating base G2 while the outer terminals OT provided on the semiconductor device SM are directed to a bottom of the floating base G2, and the package press cover G3 is closed. Consequently, respective tips of the contacts of the probe pins CP projecting from a plurality of through-holes provided in the bottom of the floating base G2 come into contact with the outer terminals OT provided on the semiconductor device SM, allowing conduction therebetween.

Structure of Probe Pin (1) First, an overall structure of the probe pin of this embodiment is described with FIGS. 4A, 4B, and 4C. FIGS. 4A, 4B, and 4C show the probe pin of this embodiment, where FIG. 4A is a schematic view of the probe pin that is not in contact with the outer terminal, FIG. 4B is a sectional view of the probe pin that is not in contact with the external terminal, and FIG. 4C is a sectional view of the probe pin in contact with the outer terminal.

As illustrated in FIGS. 4A and 4B, the probe pin CP as an elongated pin component is a movable probe pin having a tip that expands and contracts by a spring. The probe pin CP includes a first plunger PL1 having a contact CT that pierces into the outer terminal provided on the semiconductor device, a second plunger PL2 having a functional integrity with the first plunger PL1, and a first coil spring CS1 serving as a relay between the first plunger PL1 and the second plunger PL2.

The first coil spring CS1 includes a stationary portion CS1a including a coil that is fixedly and closely wound on an outer side face of the first plunger PL1, and a stretchable portion CS1b including a coil that is wound on an outer side face of the second plunger PL2 in a stretchable manner.

A tip of the contact CT of the first plunger PL1 has a split shape having acute-angled apexes to improve contact performance.

The first plunger PL1 is a hollow structure that has a through-hole running in a stretchable direction of the probe pin CP, and accommodates a slidable cleaning shaft SH in the inside thereof. The cleaning shaft SH has a roughly cylindrical shape having an upper surface to be in contact with the outer terminal and a lower surface on a side opposite to the upper surface, and has a protrusion on part of an outer side face away from each of the upper surface and the lower surface in a manner of traveling around the outer circumference of the outer side face.

The through-hole in the contact CT of the first plunger PL1 has a diameter smaller than diameter of the through-hole in other portion of the first plunger PL1. The protrusion provided on part of the outer side face of the cleaning shaft SH abuts a step formed at a position at which the diameter of the through-hole varies, thereby the cleaning shaft SH is prevented from going out of the contact CT of the first plunger PL1.

The second plunger PL2 is a hollow structure, and has a bottom at an end on a side opposite to the first plunger PL1.

Furthermore, a second coil spring CS2, which presses the cleaning shaft SH in a direction in which the cleaning shaft SH is pushed out from the contact CT of the first plunger PL1, is accommodated in the inside of each of the first plunger PL1 and the second plunger PL2. The second coil spring CS2 is accommodated while being held between the cleaning shaft SH and the bottom of the second plunger PL2. A first end of the second coil spring CS2 is spirally wound around the cleaning shaft SH on a lower side (on a side close to the second plunger PL2) compared with the protrusion provided on part of the outer side face of the cleaning shaft SH. However, the first end of the second coil spring CS2 is not fixed to the cleaning shaft SH, and a second end thereof is also not fixed to the bottom of the second plunger PL2.

As illustrated in FIGS. 4A and 4B, during standby in which the probe pin CP is not in contact with the outer terminal, the cleaning shaft SH projects from the tip of the contact CT of the first plunger PL1. The probe pin CP therefore has a structure in which a load is applied to the cleaning shaft SH by the second coil spring CS2 in a direction in which the cleaning shaft SH is pushed out from the first plunger PL1.

On the other hand, as illustrated in FIG. 4C, during testing in which the probe pin CP is in contact with the outer terminal, the tip of the contact CT of the first plunger PL1 is pressed via a solder bump SB provided on the semiconductor device. The cleaning shaft SH is pressed into the inside of the first plunger PL1 by such press force. Concurrently, the first plunger PL1 moves toward the second plunger PL2. This allows the tip of the contact CT of the first plunger PL1 to securely come into contact with the solder bump SB provided on the semiconductor device.

For the probe pin CP, the first plunger PL1, the second plunger PL2, and the first coil spring CS1 are each formed of a conductive material to establish electrical coupling with the solder bump SB provided on the semiconductor device. The first coil spring CS1 includes gold (Au)-plated stainless steel, for example. The second coil spring CS2 may be formed of either of a conductive material and an insulating material.

The cleaning shaft SH is formed of the same conductive material as that of the first plunger PL1 or the second plunger PL2. Preferably, the cleaning shaft SH is formed of a conductive material that has a resistance higher than the first plunger PL1 or the second plunger PL2 and allows the cleaning shaft SH to have a resistance value of 1Ω or higher compared with a resistance value 50 to 200 mΩ of the probe pin CP as a whole. More preferably, the cleaning shaft SH is formed of an insulating material.

Although the first coil spring CS1 is structured to include the stationary portion CS1a including the coil being fixedly and closely wound, and the stretchable portion CS1b including the coil wound in a stretchable manner, this is not limitative. For example, the stationary portion CS1a may be configured of a cylindrical plate including a conductive material.

Figure 5A:
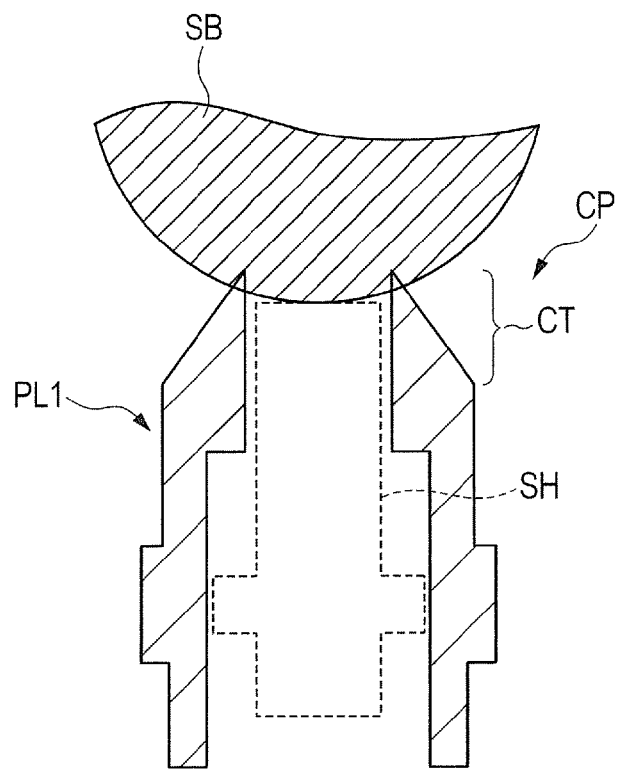
FIGS. 5A and 5B show a first plunger of the embodiment, where
Figure 5B:
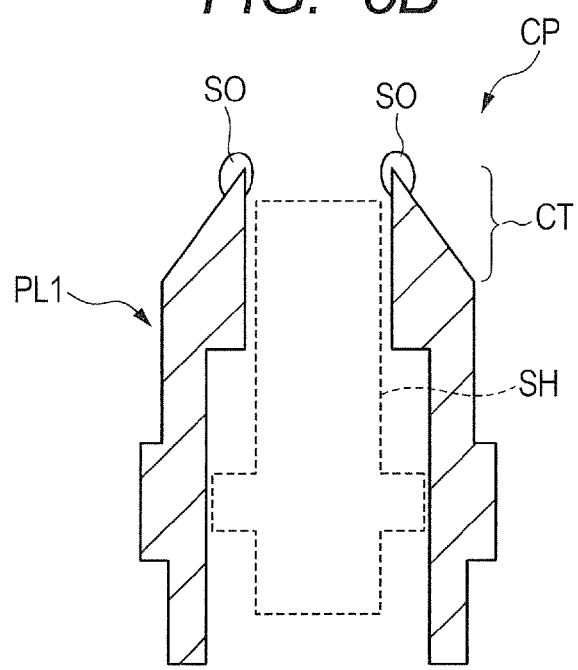

(2) Subsequently, the metal shavings adhering to the contact of the probe pin of this embodiment are described with FIGS. 5A and 5B. FIGS. 5A and 5B show the first plunger of this embodiment, where FIG. 5A is a sectional view of the first plunger in contact with the outer terminal in an enlarged manner, and FIG. 5B is a sectional view of the first plunger after the first plunger has been in contact with the outer terminal in an enlarged manner.

As illustrated in FIG. 5A, for example, for a BGA-type semiconductor device, the semiconductor device is inserted into the IC test socket, the probe pins CP are brought into contact with the solder bumps SB as the outer terminals, and in such a state, a predetermined electric signal is transmitted from a tester to the probe pins CP to perform electrical testing.

The tip of the contact CT of the first plunger PL1 has a split shape having acute-angled apexes to improve contact performance. When the tip of the contact CT is brought into contact with the solder bump SB, the tip pierces into the solder bump SB.

As a result, as illustrated in FIG. 5B, solder shavings SO adhere to the tip of the contact CT. The probe pin CP has a small area (the number) of true contact points of the tip of the contact CT, which pierces into the solder bump SB; hence, when the probe pin CP is repeatedly brought into contact with the solder bump SB several times, the area of the true contact points varies due to adhesion of the solder shavings SO to the tip of the contact CT.

The main component of the solder bump SB is tin (Sn), and tin (Sn) attached to the tip of the contact CT is easily oxidized and formed into SnO or $SnO_2$ (tin oxide). As a result, the solder shavings SO attached to the tip of the contact CTR become an insulator, leading to an increase in contact resistance.

Figure 6:
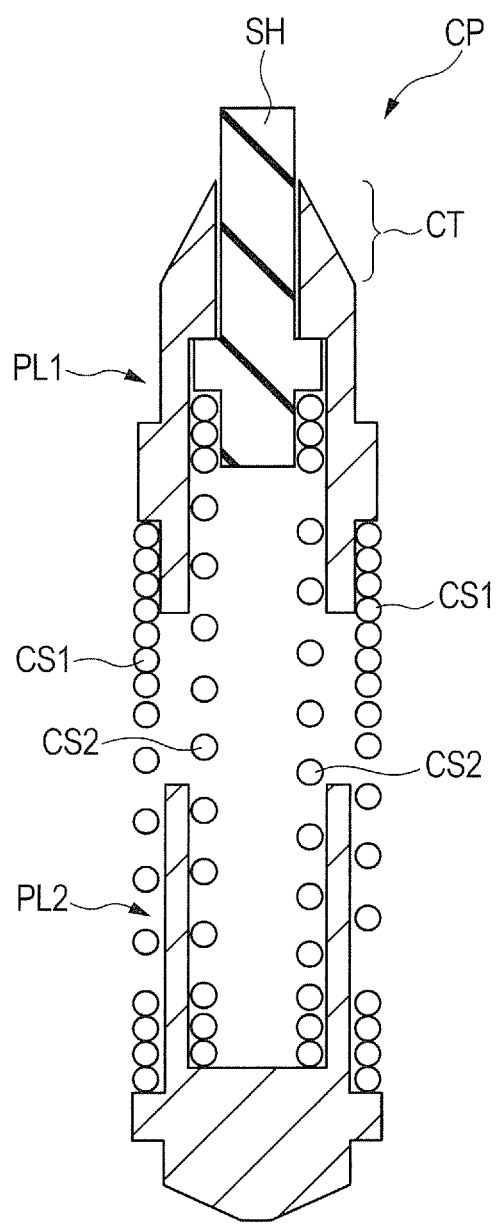
FIG. 6 is a sectional view of the probe pin to explain spring pressure of each of first and second coil springs of the embodiment.

(3) Spring pressure of each of the first and second coil springs of this embodiment is now described with FIG. 6. FIG. 6 is a sectional view of the probe pin to explain the spring pressure of each of the first and second coil springs of this embodiment.

The first coil spring CS1 wound on the outer side face of each of the first plunger PL1 and the second plunger PL2 is a helical compression spring that presses the tip of the contact CT of the first plunger PL1 to the outer terminal provided on the semiconductor device so as to bring the tip of the contact CT of the first plunger PL1 into contact with the outer terminal provided on the semiconductor device. Hence, spring pressure of the first coil spring CS1 is set to be relatively high to reduce contact resistance, and is, for example, about 35 gf.

The second coil spring CS2 accommodated in the inside of each of the first plunger PL1 and the second plunger PL2 is a helical compression spring that projects the cleaning shaft SH from the contact CT of the first plunger PL1. Hence, if spring pressure of the second coil spring CS2 is excessively high, the pressed second coil spring CS2 is less likely to return to a position before press (original state) even if pressing force is no longer applied; hence, the spring pressure of the second coil spring CS2 is set to be relatively low, for example, about 10 gf.

If the total contact pressure of the first coil spring CS1 and the second coil spring CS2 is excessively high, the probe pin cannot be pushed by a pusher (for example, a package press cover G3 illustrated in FIG. 2). Hence, the total contact pressure of the first coil spring CS1 and the second coil spring CS2 is desired to be about 45 gh, for example.

Figure 7:
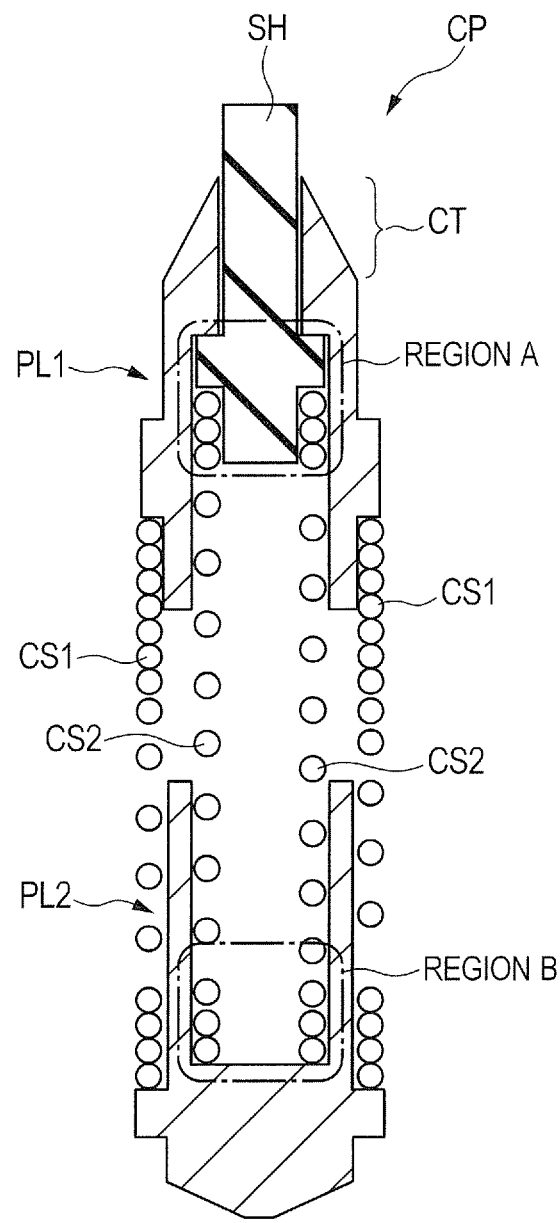
FIG. 7 is a sectional view of the probe pin to explain an aspect of fixation of the second coil spring of the embodiment.

(4) An aspect of fixation of the second coil spring of this embodiment is now described with FIG. 7. FIG. 7 is a sectional view of the probe pin to explain the aspect of fixation of the second coil spring of this embodiment.

Although the second coil spring CS2 is accommodated in the inside of each of the first plunger PL1 and the second plunger PL2 while being held between the cleaning shaft SH and the bottom of the second plunger PL2, either end of the second coil spring CS2 is not fixed.

In a region A illustrated in FIG. 7, a first end of the second coil spring CS2 is spirally wound around the cleaning shaft SH on a lower side (on a side close to the second plunger PL2) compared with the protrusion provided on part of the outer side face of the cleaning shaft SH. However, the second coil spring CS2 is not crimped (fixed), so that the cleaning shaft SH can freely rotate or incline.

In a region B illustrated in FIG. 7, a second end of the second coil spring CS2 is not fixed to the bottom of the second plunger PL2, so that the second coil spring CS2 can freely rotate. Consequently, the cleaning shaft SH can move more freely.

The second coil spring CS2 being a clockwise spring rotates clockwise when it is compressed. However, when pressing force is no longer applied and the pressed second coil spring CS2 returns to an original position, the second coil spring CS2 rotates counterclockwise. By using this phenomenon, the cleaning shaft SH is allowed to continuously vary in position without imbalance within the first plunger PL1.

(5) A space between the first plunger and the cleaning shaft of this embodiment is now described with FIGS. 8A and 8B. FIGS. 8A and 8B are each a sectional view of part of the probe pin to explain a space between the first plunger and the cleaning shaft of this embodiment, where FIG. 8A is a sectional view illustrating part of the probe pin that is not in contact with the outer terminal in an enlarged manner, and FIG. 8B is a sectional view illustrating part of the probe pin in contact with the outer terminal in an enlarged manner.

As illustrated in FIG. 8A, when the probe pin CP is not in contact with the outer terminal, certain spaces La and Lb are provided between the inner side face (inner wall) of the contact CT of the first plunger PL1 and the outer side face of the cleaning shaft SH in order to improve slidability of the cleaning shaft SH. The spaces La and Lb are each, for example, about 4 to 6 μm, and exemplified by 5 μm (La=Lb=5 μm) as a typical value.

As illustrated in FIG. 8B, when the probe pin CP is pushed by a pusher and comes into contact with the outer terminal, the cleaning shaft SH inclines and comes into contact with the inner side face (inner wall) of the contact CT of the first plunger PL1. This is because the second coil spring CS2 is not fixed as described with FIG. 7 and thus deflects without being compressed in a stretchable direction of the probe pin CP.

Figure 10A:
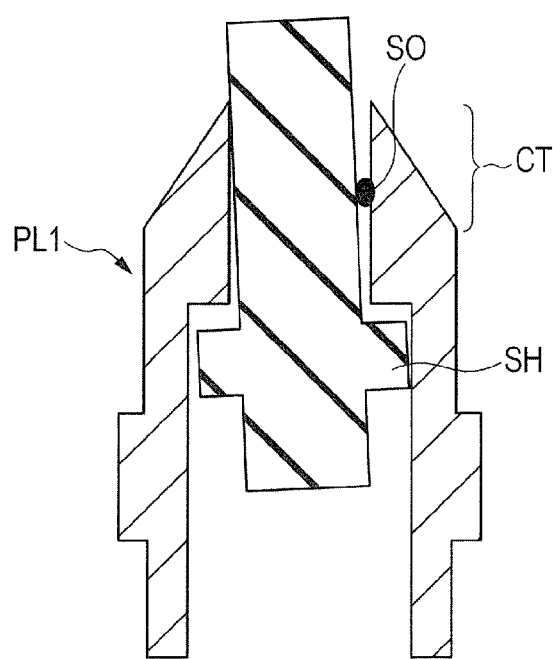
FIGS. 10A and 10B show the probe pin of the embodiment, where
Figure 10B:
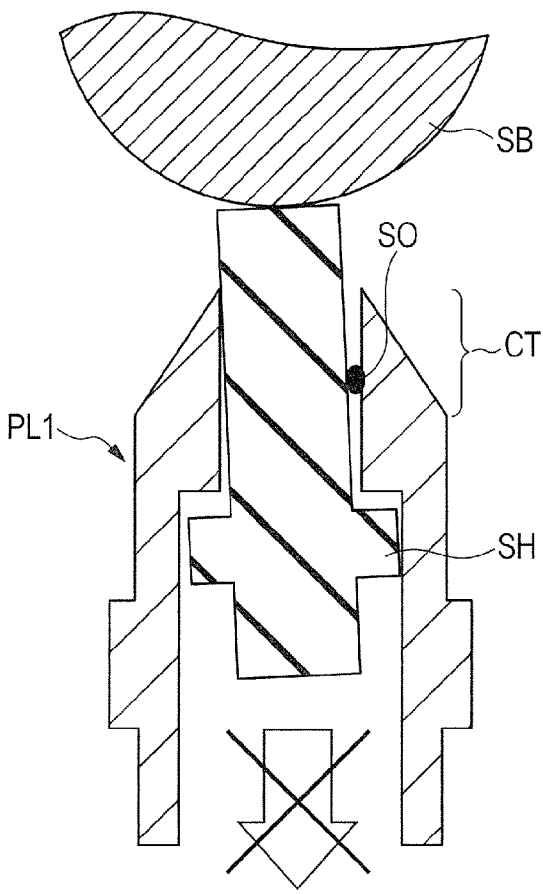

(6) A material of each of the first plunger and the cleaning shaft of this embodiment is described with FIGS. 9, 10A, and 10B. FIG. 9 is a perspective view illustrating part of the probe pin to explain a material of each of the first plunger and the cleaning shaft of this embodiment. FIGS. 10A and 10B show the probe pin of this embodiment, where FIG. 10A is a sectional view illustrating part of the probe pin that is not in contact with the outer terminal in an enlarged manner, and FIG. 10B is a sectional view illustrating part of the probe pin in contact with the outer terminal in an enlarged manner.

The first plunger PL1 illustrated in FIG. 9 is formed of a low-resistance material to reduce contact resistance. The first plunger PL1 includes gold (Au)-plated stainless steel or a platinum (Pd) alloy, for example.

The cleaning shaft SH illustrated in FIG. 9 is formed of a conductive material or an insulating material, and is preferably formed of a high-resistance material to increase contact resistance to early find a trouble if the trouble occurs. The cleaning shaft SH includes stainless steel or a nonmetal, for example.

For example, as illustrated in FIG. 10A, such a trouble may occur when a foreign substance such as the solder shavings SO enters a gap between the inner side face (inner wall) of the first plunger PL1 and an outer side face of the cleaning shaft SH, and thus smooth sliding of the cleaning shaft SH is obstructed.

In such a case, as illustrated in FIG. 10B, since the cleaning shaft SH does not enter into the inside of the first plunger PL1, the solder bump SB does not reach the first plunger PL1, and thus measurement cannot be performed. Such a measurement result is early fed back and measurement is stopped, thereby it is possible to prevent collapse and outflow of a large number of solder bumps SB.

The second plunger may include either of a conductive material and an insulating material, and may include the same material as the material of the first plunger PL1 or a material different from that.

Testing Step after Assembly of Semiconductor Device

A testing step after assembly of the semiconductor device of this embodiment is now described.

First, the semiconductor device SM illustrated in FIG. 1 and the IC test socket TS illustrated in FIG. 2 are provided. The semiconductor device SM is mounted in the floating base G2 while the outer terminals OT provided on the semiconductor device SM are directed to the bottom of the floating base G2. Subsequently, the package press cover G3 is closed. Consequently, the respective tips of the contacts of the first plungers configuring the probe pins project from a plurality of through-holes provided in the bottom of the floating base G2, and the outer terminals OT provided on the semiconductor device SM come into contact with the tips of the contacts of the first plungers configuring the probe pins, and a predetermined electric signal is transmitted from an external tester to the semiconductor device SM and thus electrical testing is performed. At this time, for example, as illustrated in FIG. 5A, the tips of the contacts CT pierce into the solder bumps SB as the outer terminals OT.

Sequential Operation of Probe Pin

Figure 11:
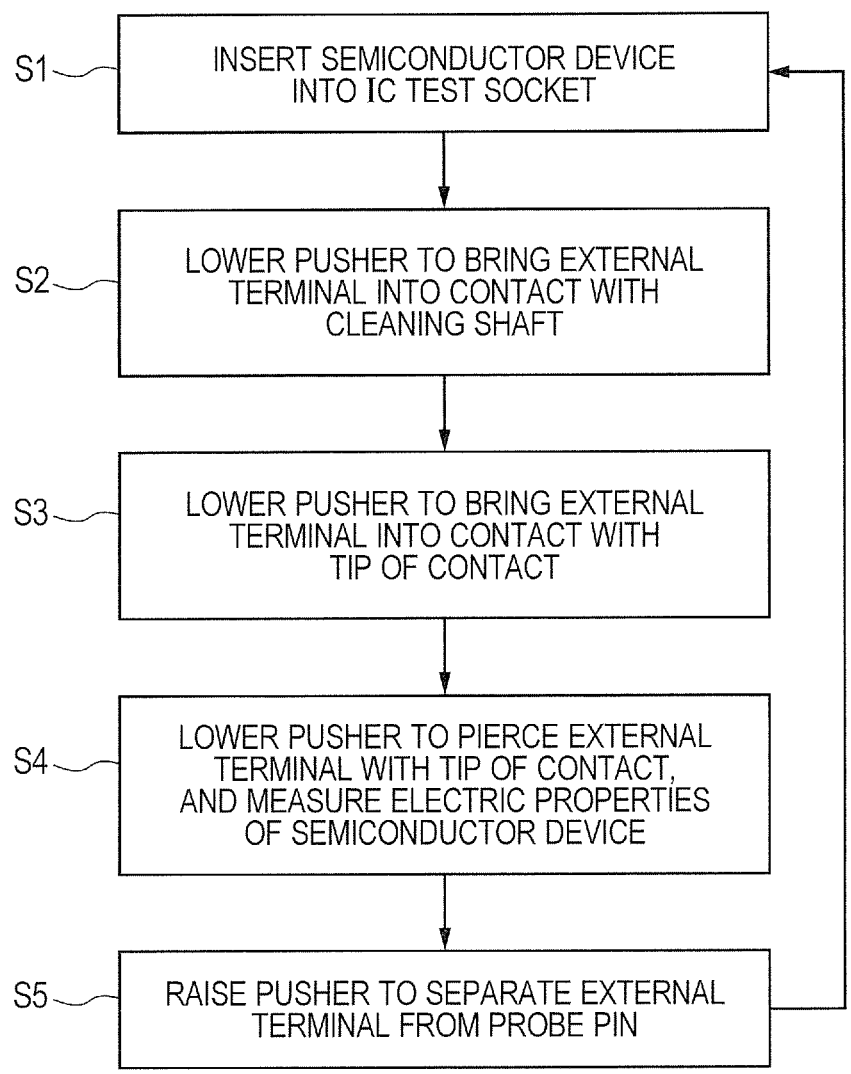
FIG. 11 is a flowchart explaining sequential operation of the probe pin of the embodiment.
Figure 16A:
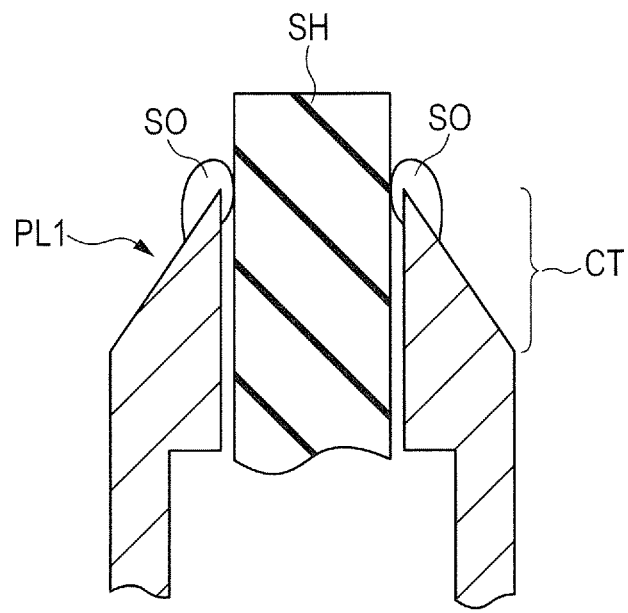
FIGS. 16A and 16B are each a sectional view of the probe pin to explain solder shavings adhering to the tip of the contact of the first plunger of the embodiment, where
Figure 16B:
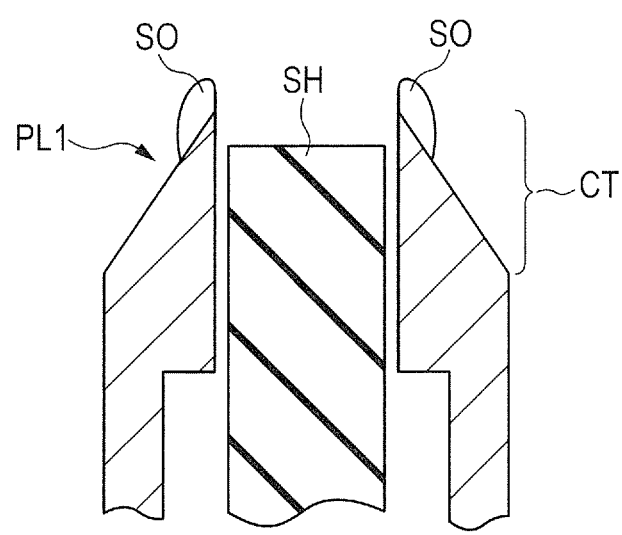

Sequential operation of the probe pin of this embodiment is now described with FIGS. 11 to 16B. FIG. 11 is a flowchart explaining sequential operation of the probe pin of this embodiment. FIGS. 12A to 13E include sectional views explaining sequential operation of the probe pin of this embodiment. FIGS. 14A and 14B are each a sectional view of the probe pin to explain solder shavings adhering to the tip of the contact of the first plunger of this embodiment, where FIG. 14A is a sectional view illustrating the tip of the contact, to which solder shavings are attached, in an enlarged manner, and FIG. 14B is a sectional view illustrating the tip of the contact, from which some of the solder shavings has been removed, in an enlarged manner. FIG. 15 includes sectional views of the probe pin of this embodiment to explain sequential operation of the probe pin. FIGS. 16A and 16B are each a sectional view of the probe pin to explain solder shavings adhering to the tip of the contact of the first plunger of this embodiment, where FIG. 16A is a sectional view illustrating the tip of the contact, to which solder shavings are attached, in an enlarged manner, and FIG. 16B is a sectional view illustrating the tip of the contact, from which some of the solder shavings has been removed, in an enlarged manner.

(I) First Electrical Testing of Semiconductor Device

First, an unused IC test socket having a plurality of probe pins CP and a semiconductor device to be subjected to electrical testing are provided, and the semiconductor device is inserted into the IC test socket (step S1 of FIG. 11). The semiconductor device is exemplified by a BGA-type semiconductor package having solder bumps SB as outer terminals. An aspect of the probe pin CP in such a situation is shown in FIG. 12A.

Subsequently, as illustrated in FIG. 12B, a pusher is lowered to press the semiconductor device, thereby each solder bump SB provided on the semiconductor device is brought close to the probe pin CP so as to abut the cleaning shaft SH (step S2 of FIG. 11).

Subsequently, as illustrated in FIG. 12C, the pusher is further lowered to press the semiconductor device, thereby the cleaning shaft SH is exclusively pressed and is pushed into the inside of the first plunger PL1 so that the solder bump SB abuts the tip of the contact CT of the first plunger PL1 (step S3 of FIG. 11). At this time, only the second coil spring CS2 is compressed.

Subsequently, as illustrated in FIG. 12D, the pusher is further lowered to press the semiconductor device, thereby the first plunger PL1 and the cleaning shaft SH are pressed, and thus the solder bump SB is pierced with the tip of the contact CT of the first plunger PL1. In such a state, a predetermined electric signal is transmitted from a tester to the probe pins CP to perform electrical testing (step S4 of FIG. 11). At this time, the first coil spring CS1 and the second coil spring CS2 are compressed.

Subsequently, as illustrated in FIG. 12E, the pusher is raised to return the semiconductor device to an original position at which the semiconductor device has been mounted in the IC test socket, thereby the solder bump SB is separated from the first plunger PL1 and the cleaning shaft SH (step S5 of FIG. 11). At this time, compression of the first coil spring CS1 and the second coil spring CS2 is released, and the coil springs CS1 and CS2 are each returned to an original state before press, and concurrently each of the first plunger PL1 and the cleaning shaft SH rises and returns to the original position before press.

The first electrical testing of the semiconductor device mounted in the IC test socket is finished after such steps S1 to S5 have been performed as one cycle.

(II) Second Electrical Testing of Semiconductor Device

Subsequently, a semiconductor device to be subjected to electrical testing is provided, and the semiconductor device is inserted into the IC test socket (step S1 of FIG. 11). The tip of the contact CT of the first plunger PL1 has solder shavings SO attached to the tip during the first electrical testing of the semiconductor device.

Figure 14A:
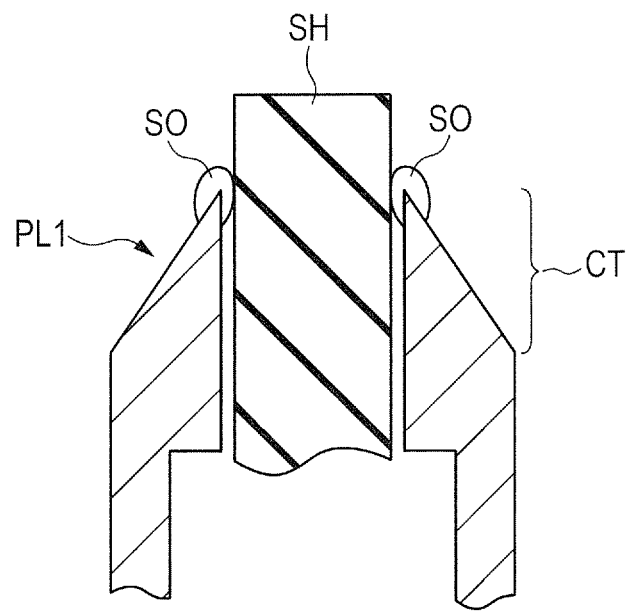
FIGS. 14A and 14B are each a sectional view of the probe pin to explain solder shavings adhering to a tip of a contact of the first plunger of the embodiment, where

An aspect of the probe pin CP in such a situation is shown in FIG. 13A, and FIG. 14A shows an aspect of the solder shavings SO attached to the tip of the contact CT of the first plunger PL1.

Subsequently, as illustrated in FIG. 13B, the pusher is lowered to press the semiconductor device, thereby each solder bump SB provided on the semiconductor device is brought close to the probe pin CP so as to abut the cleaning shaft SH (step S2 of FIG. 11).

Subsequently, as illustrated in FIG. 13C, the pusher is further lowered to press the semiconductor device, thereby the cleaning shaft SH is exclusively pressed and is pushed into the inside of the first plunger PL1 so that the solder bump SB abuts the tip of the contact CT of the first plunger PL1 (step S3 of FIG. 11). At this time, only the second coil spring CS2 is compressed.

Figure 14B:
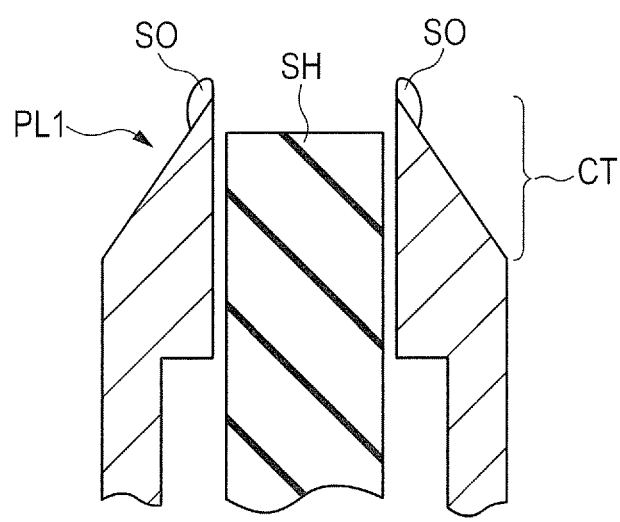

FIG. 14B shows an aspect of the solder shavings SO attached to the tip of the contact CT of the first plunger PL1 in such a situation. The cleaning shaft SH is pushed into the inside of the first plunger PL1, thereby some of the solder shavings SO is removed. Although the solder shavings SO attached to the tip of the contact CT are difficult to be entirely removed, some of the solder shavings SO is removed, thereby area of true contact points at the tip of the contact CT, which pierces into the solder bump SB, can be increased compared with the case where the solder shavings SO are not removed at all. In particular, since most of the solder shavings SO attached to the inner side face (inner wall) of the contact CT can be removed, a variation in area of true contact points can be maintained substantially constant.

The solder shavings SO removed from the tip of the contact CT are accumulated on the bottom of the second plunger PL2.

Subsequently, as illustrated in FIG. 13D, the pusher is further lowered to press the semiconductor device, thereby the first plunger PL1 and the cleaning shaft SH are pressed, and thus the solder bump SB is pierced with the tip of the contact CT of the first plunger PL1. In such a state, a predetermined electric signal is transmitted from a tester to the probe pins CP to perform electrical testing (step S4 of FIG. 11). At this time, the first coil spring CS1 and the second coil spring CS2 are compressed.

As described above, since some of the solder shavings SO, which have attached during the first electrical testing of the semiconductor device, is removed, an increase and a variation in contact resistance can be suppressed. Consequently, electrical testing of the semiconductor device can be performed reproducibly and stably.

Subsequently, as illustrated in FIG. 13E, the pusher is raised to return the semiconductor device to an original position at which the semiconductor device has been mounted in the IC test socket, thereby the solder bump SB is separated from the first plunger PL1 and the cleaning shaft SH (step S5 of FIG. 11). At this time, compression of the first coil spring CS1 and the second coil spring CS2 is released, and the coil springs CS1 and CS2 are each returned to an original state before press, and concurrently each of the first plunger PL1 and the cleaning shaft SH rises and returns to the original position before press. At this time, some of the solder shavings SO attached to the tip of the contact CT of the first plunger PL1 can also be removed by the cleaning shaft SH.

The second electrical testing of the semiconductor device mounted in the IC test socket is finished after such steps S1 to S5 have been performed as one cycle.

(III) Third Electrical Testing of Semiconductor Device

Subsequently, a semiconductor device to be subjected to electrical testing is provided, and the semiconductor device is inserted into the IC test socket (step S1 of FIG. 11). The tip of the contact CT of the first plunger PL1 has part of the solder shavings SO attached to the tip during the first electrical testing of the semiconductor device, and has the solder shavings SO attached to the tip during the second electrical testing of the semiconductor device.

An aspect of the probe pin CP in such a situation is shown in FIG. 15A, and FIG. 16A shows an aspect of the solder shavings SO attached to the tip of the contact CT of the first plunger PL1.

Subsequently, as illustrated in FIG. 15B, the pusher is lowered to press the semiconductor device, thereby each solder bump SB provided on the semiconductor device is brought close to the probe pin CP so as to abut the cleaning shaft SH (step S2 of FIG. 11).

Subsequently, as illustrated in FIG. 15C, the pusher is further lowered to press the semiconductor device, thereby the cleaning shaft SH is exclusively pressed and is pushed into the inside of the first plunger PL1 so that the solder bump SB abuts the tip of the contact CT of the first plunger PL1 (step S3 of FIG. 11). At this time, only the second coil spring CS2 is compressed.

FIG. 16B shows an aspect of the solder shavings SO attached to the tip of the contact CT of the first plunger PL1 in such a situation. As with the second electrical testing of the semiconductor device (see FIG. 14B), the cleaning shaft SH is pushed into the inside of the first plunger PL1, thereby some of the solder shavings SO is removed.

Subsequently, as illustrated in FIG. 15D, the pusher is further lowered to press the semiconductor device, thereby the first plunger PL1 and the cleaning shaft SH are pressed, and thus the solder bump SB is pierced with the tip of the contact CT of the first plunger PL1. In such a state, a predetermined electric signal is transmitted from a tester to the probe pins CP to perform electrical testing (step S4 of FIG. 11). At this time, the first coil spring CS1 and the second coil spring CS2 are compressed.

As described above, since some of the solder shavings SO, which have attached during the first electrical testing and the second electrical testing of the semiconductor device, is removed, an increase and a variation in contact resistance can be suppressed. Consequently, electrical testing of the semiconductor device can be performed reproducibly and stably.

Subsequently, as illustrated in FIG. 15E, the pusher is raised to return the semiconductor device to an original position at which the semiconductor device has been mounted in the IC test socket, thereby the solder bump SB is separated from the first plunger PL1 and the cleaning shaft SH (step S5 of FIG. 11). At this time, compression of the first coil spring CS1 and the second coil spring CS2 is released, and the coil springs CS1 and CS2 are each returned to an original state before press, and concurrently each of the first plunger PL1 and the cleaning shaft SH rises and returns to the original position before press. At this time, some of the solder shavings SO attached to the tip of the contact CT of the first plunger PL1 can also be removed by the cleaning shaft SH.

The third electrical testing of the semiconductor device mounted in the IC test socket is finished after such steps S1 to S5 have been performed as one cycle.

After that, in like manner, electrical testing of the semiconductor device mounted in the IC test socket is performed through such steps S1 to S5 as one cycle.

Figure 17:
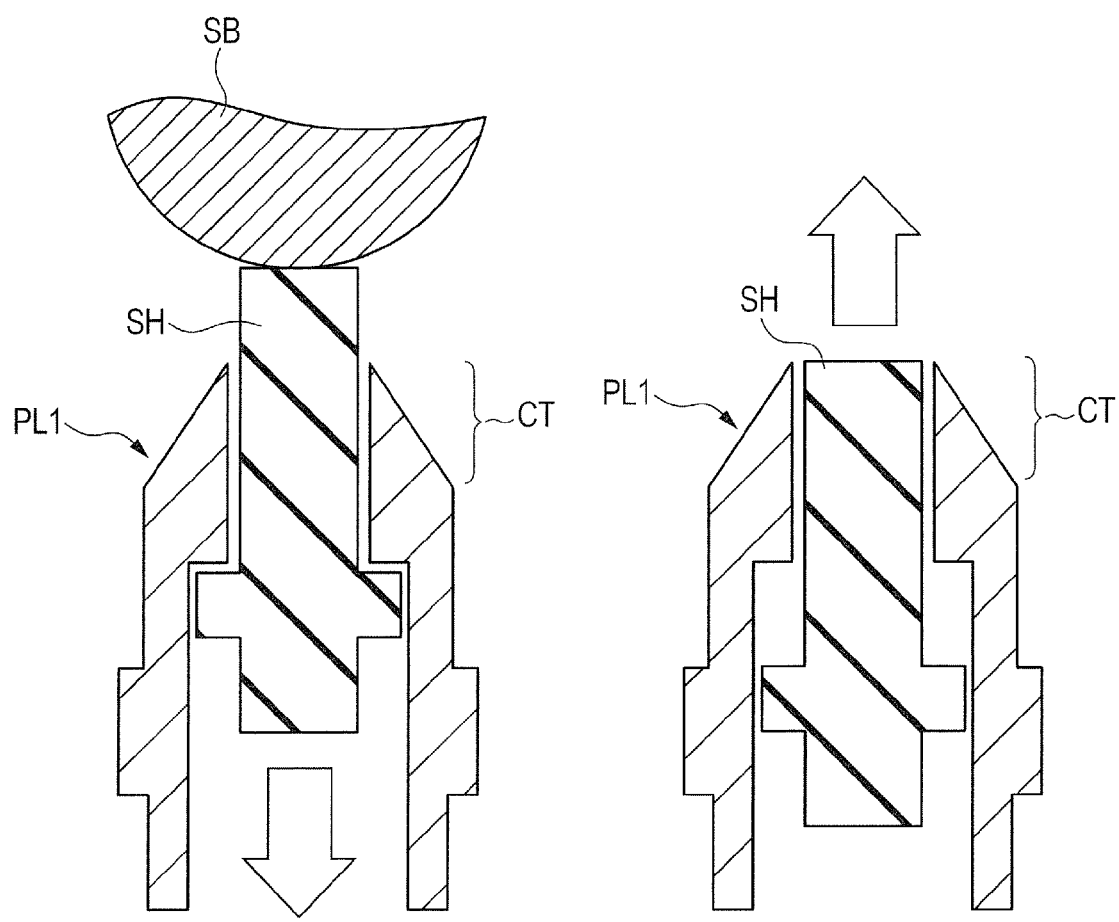
FIG. 17 includes sectional views illustrating part of the probe pin to explain motion of the cleaning shaft of the embodiment.

FIG. 17 includes sectional views illustrating part of the probe pin to explain motion of the cleaning shaft of this embodiment.

This embodiment is mainly characterized as follows. That is, the probe pin is made to have a hollow structure, and the cleaning shaft is provided within the hollow structure. In addition, metal shavings such as solder shavings, which are attached to the tip of the contact of the first plunger configuring the probe pin, are removed by sliding of the cleaning shaft.

As illustrated in FIG. 17, the solder shavings attached to the tip of the contact CT of the first plunger PL1 are removed when the cleaning shaft SH is pushed into the inside of the first plunger PL1 by the pusher (see the step S3 of FIG. 11) and when the cleaning shaft SH rises (see the step S5 of FIG. 11).

Specifically, the cleaning shaft SH is allowed to slide using the pushing force of the pusher and the force of the second coil spring CS2 to return to the original state before compression, thereby some of the solder shavings is scraped from the tip of the contact CT of the first plunger PL1.

However, since the return force of the second coil spring CS2 is weaker than the pushing force of the pusher, the solder shavings are scraped mainly when the cleaning shaft SH is pushed into the inside of the first plunger PL1 by the pusher.

Shape of Probe Pin

Various shapes of the probe pin of this embodiment are now described with FIGS. 18, 18A, 18B, and 18C and FIGS. 19A, 19B, 19C, and 19D.

Figure 18:
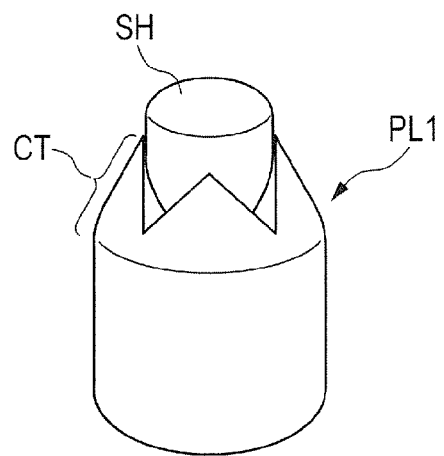
FIGS. 18, 18A, 18B, and 18C are side views illustrating various shapes of the cleaning shaft of the embodiment.
Figure 18A:
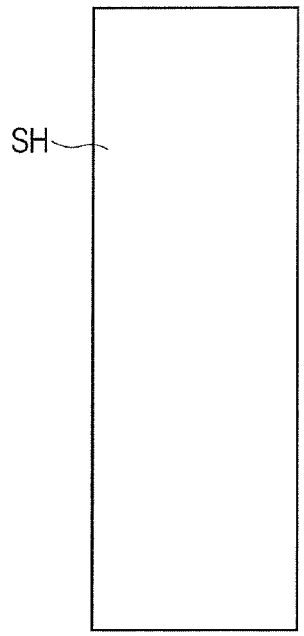
Figure 18B:
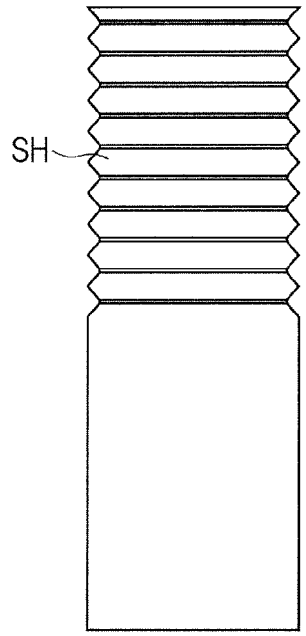
Figure 18C:
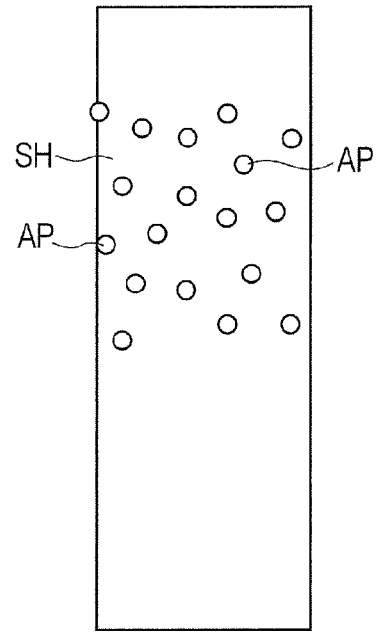

FIGS. 18A, 18B, and 18C are side views illustrating various shapes of the cleaning shaft of this embodiment.

As illustrated in FIGS. 18, 18A, 18B, and 18C, the cleaning shaft SH has a roughly cylindrical shape. This allows the cleaning shaft SH to be slidable through the through-hole provided in the inside of the first plunger PL1. The outer side face of the cleaning shaft SH may be even (FIG. 18A) or uneven (FIGS. 18B and 18C). The outer side face of the cleaning shaft SH is made uneven, thereby the effect of scraping the solder shavings attached to the tip of the contact CT can be improved.

The uneven outer side face includes, for example, a side face in which projections and depressions are periodically repeated with a constant interval in a sliding direction as shown in FIG. 18B, and a side face in which abrasive particles AP are randomly embedded as shown in FIG. 18C. Since such unevenness is provided to improve the effect of scraping the solder shavings attached to the tip of the contact CT, the unevenness should be provided on at least part of the outer side face of the cleaning shaft SH passing through the tip of the contact CT.

FIGS. 19A, 19B, 19C, and 19D are perspective views illustrating various shapes of the contact of the probe pin of this embodiment.

As illustrated in FIGS. 19A, 19B, 19C, and 19D, the shapes of the contact CT of the first plunger PL1 can be exemplified by a split shape, a flat shape, a concave conical shape (a shape conically depressed in a direction in which the probe pin is pressed), and a convex conical shape.

As illustrated in FIG. 19A, the tip of the contact CT is made to have a split shape having acute-angled apexes, thereby the tip of the contact CT easily pierces the outer terminal, which can improve contact performance. As illustrated in FIGS. 19C and 19D, the tip of the contact CT is made to have a conical shape, thereby when a ball-shaped outer terminal (for example, a solder bump) is used, the outer terminal is less likely to slip; hence, the outer terminal can be securely received by the first plunger PL1.

As illustrated in FIGS. 19B, 19C and 19D, the solder shavings may also adhere to the tip of the contact CT in the case of each of the flat and conical contacts CT. For such shapes, however, the solder shavings attached to the tip of the contact CT can be also removed by the cleaning shaft SH.

Measurement Examples of Various Semiconductor Devices

Measurement examples of various semiconductor devices of this embodiment are now described with FIGS. 20A and 20B, FIGS. 21A and 21B, and FIGS. 22A and 22B.

Figure 20A:
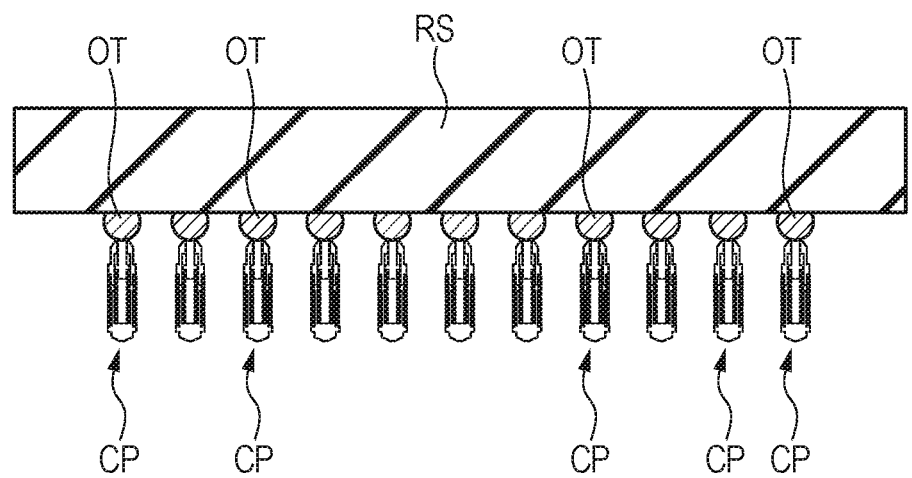
FIGS. 20A and 20B are schematic illustrations of a measurement example of electrical properties in a testing step of a BGA-type semiconductor device of the embodiment, where
Figure 20B:
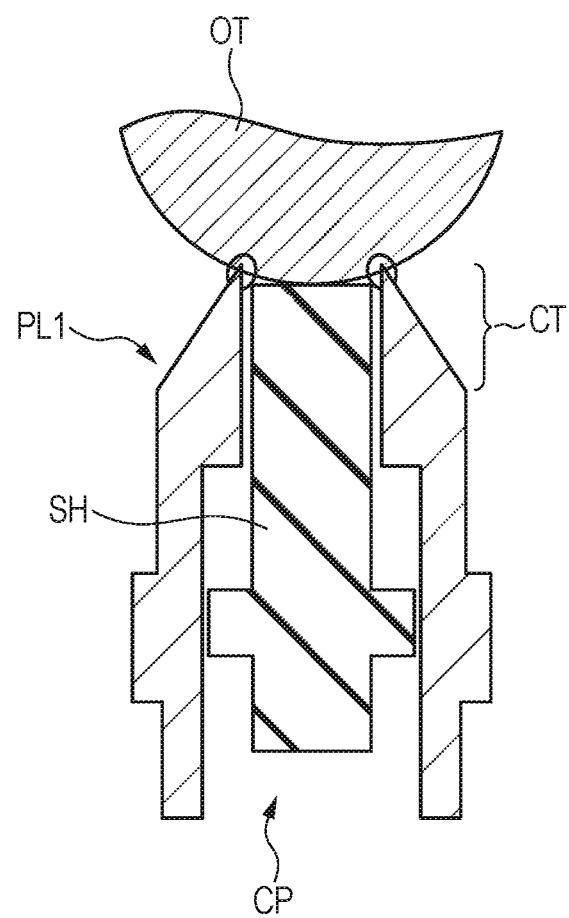

FIGS. 20A and 20B are schematic illustrations of a measurement example of electrical properties in a testing step of a BGA-type semiconductor device of this embodiment, where FIG. 20A is a schematic view illustrating the semiconductor device as a whole, and FIG. 20B is a sectional view illustrating part of each of an outer terminal and a probe pin in an enlarged manner.

As illustrated in FIG. 1, the BGA-type semiconductor device is a type of surface-mount semiconductor package, in which lead electrodes (outer terminals) from the package include a metal such as a ball-shaped solder, and are arranged in a grid pattern on a lower surface of a casing.

As illustrated in FIGS. 20A and 20B, for the BGA-type semiconductor device, each of the outer terminals OT arranged in a grid pattern on the lower surface of the casing (sealant RS) is pierced with the tip of the contact CT of the first plunger PL1 configuring the probe pin CP to measure the electrical properties of the semiconductor device.

Figure 21A:
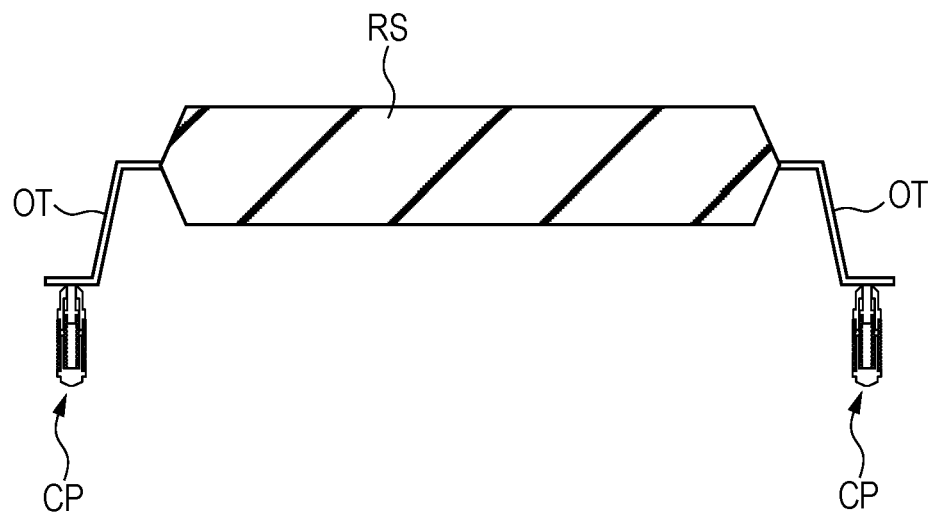
FIGS. 21A and 21B are schematic illustrations of a measurement example of electrical properties in a testing step of a QFP-type semiconductor device or an SOP-type semiconductor device of the embodiment, where
Figure 21B:
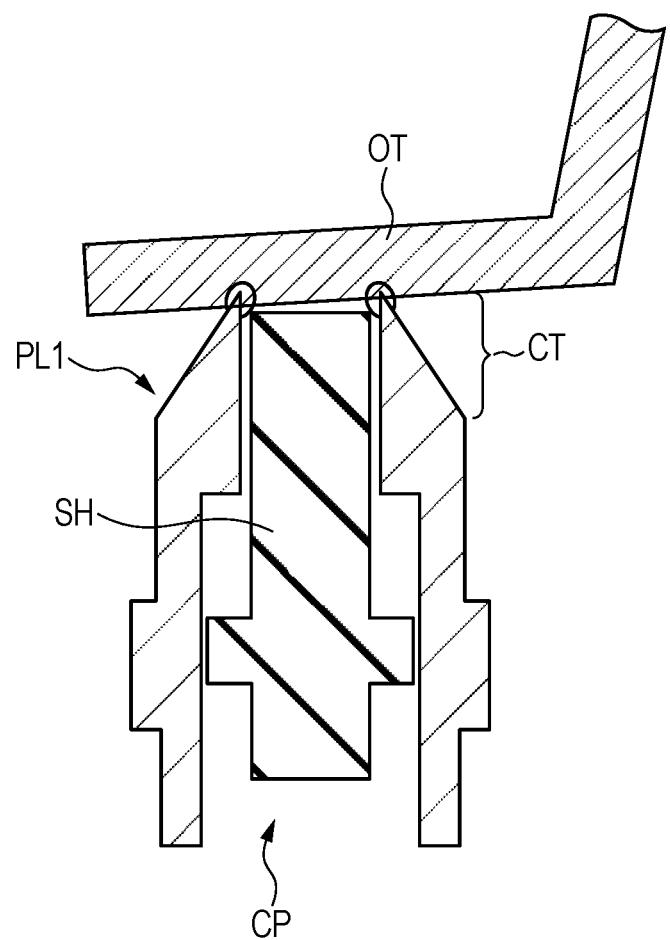

FIGS. 21A and 21B are schematic illustrations of a measurement example of electrical properties in a testing step of a quad flat package (QFP)-type semiconductor device or a small outline package (SOP)-type semiconductor device of this embodiment, where FIG. 21A is a schematic view illustrating the semiconductor device as a whole, and FIG. 21B is a sectional view illustrating part of each of the outer terminal and the probe pin in an enlarged manner.

The QFP-type semiconductor device is a type of surface-mount semiconductor package, in which lead pins (outer terminals) extend outward from four side faces of a casing and are each bent in an L shape (gull-wing shape). The SOP-type semiconductor device is a type of surface-mount semiconductor package, in which lead pins (outer terminals) extend outward from two opposed side faces of a casing and are each bent in an L shape (gull-wing shape).

As illustrated in FIGS. 21A and 21B, for the QFP- or SOP-type semiconductor device, each of the outer terminals OT extending from the side faces of the casing (sealant RS) is pierced with the tip of the contact CT of the first plunger PL1 configuring the probe pin CP to measure the electrical properties of the semiconductor device.

Figure 22A:
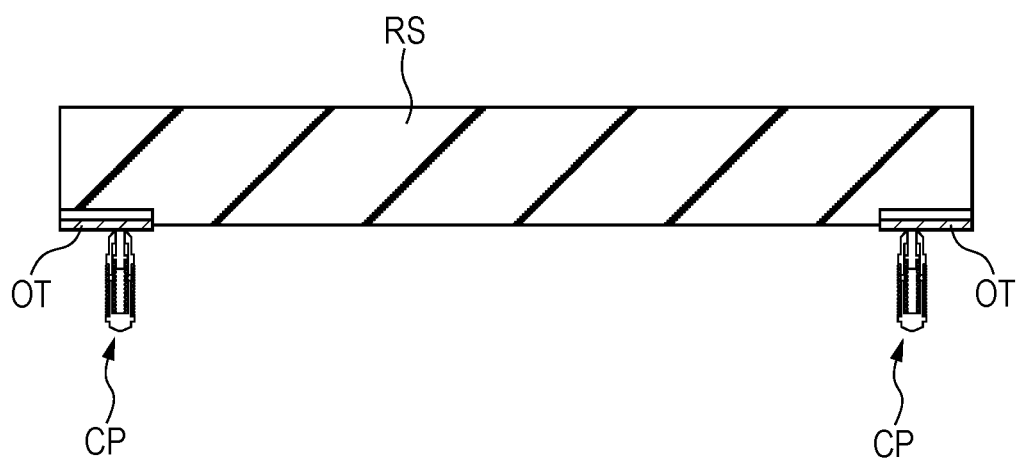
FIGS. 22A and 22B are schematic illustrations of a measurement example of electrical properties in a testing step of a QFN-type semiconductor device of the embodiment, where
Figure 22B:
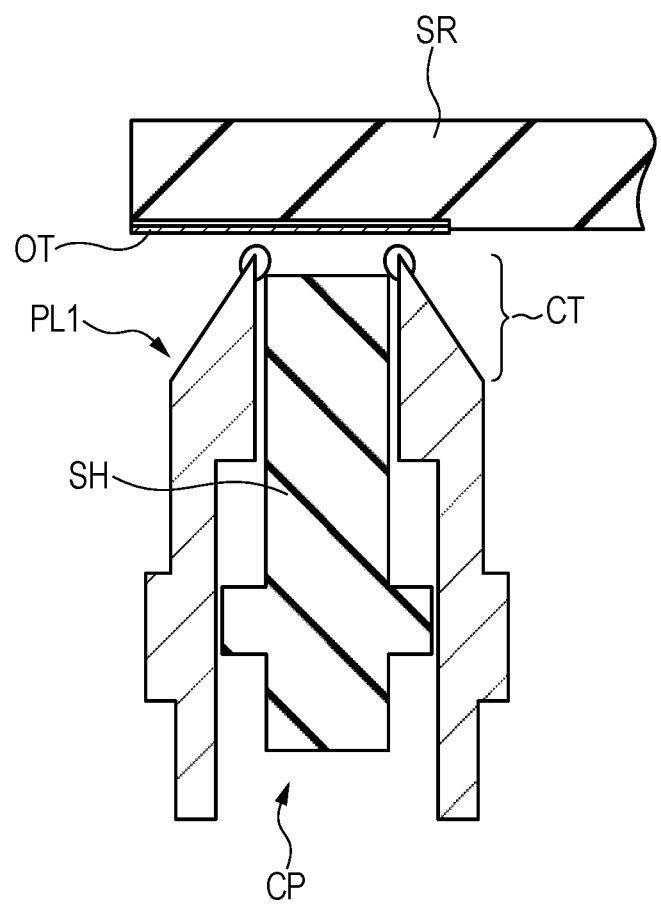

FIGS. 22A and 22B are schematic illustrations of a measurement example of electrical properties in a testing step of a quad for non-lead package (QFN)-type semiconductor device of this embodiment, where FIG. 22A is a view illustrating the semiconductor device as a whole, and FIG. 22B is a sectional view illustrating part of each of the outer terminal and the probe pin in an enlarged manner.

The QFN-type semiconductor device is a type of surface-mount semiconductor package, in which lead electrodes (outer terminals) from the package are arranged on the periphery of a lower surface of a casing.

As illustrated in FIGS. 22A and 22B, each of the outer terminals OT arranged on the lower surface of the casing (sealant RS) is pierced with the tip of the contact CT of the first plunger PL1 configuring the probe pin CP to measure the electrical properties of the semiconductor device.

Modification of Embodiment

Although the above-described embodiment has been described with the probe pin provided in the IC test socket used in electrical testing after assembling the semiconductor device, this is not limitative. For example, the invention can be applied to a probe pin provided in a probe card used in determination of quality of each of a plurality of semiconductor chips dividedly formed on a main surface of a semiconductor wafer.

FIG. 23 is a sectional view to explain a probe pin provided in a probe card according to a modification of this embodiment.

As illustrated in FIG. 23, a semiconductor wafer SW is divided in a plurality of chip regions CA, and a plurality of electrode pads EPA, which are each electrically coupled to a semiconductor integrated circuit, are provided on the respective main surfaces of the chip regions CA. Such electrode pads EPA are configured of, for example, an interconnection in an uppermost layer of a multilayered interconnection layer of the semiconductor integrated circuit, and part of an upper surface of each electrode pad EPA is exposed from an opening OP provided in a surface protective film SP in correspondence to the electrode pad EPA. The electrode pad EPA includes, for example, aluminum (Al) or copper (Cu).

Each of the electrode pads EPA is pierced with the tip of the contact CT of the first plunger PL1 configuring the probe pin CP to measure the electrical properties of the semiconductor integrated circuit. In this case, as with the probe pin provided in the IC test socket, metal shavings attached to the tip of the contact CT can be removed by the cleaning shaft SH.

Although the invention achieved by the inventors has been described in detail according to one embodiment thereof hereinbefore, the invention should not be limited thereto, and it will be appreciated that various modifications or alterations thereof may be made within the scope without departing from the gist of the invention.

The invention includes at least the following embodiments.

Supplementary Note 1

A method of manufacturing a semiconductor device includes the steps of:

(a) providing a semiconductor wafer having a main surface divided in a plurality of chip regions, each of the chip regions having a semiconductor integrated circuit; and (b) bringing a probe pin into contact with each of a plurality of electrode pads provided on the respective chip regions to measure electrical properties of the semiconductor integrated circuit, the probe pin including:

(i) a hollow-structured first plunger that configures an upper part of the probe pin and has a contact that comes into contact with the electrode pad;

(ii) a hollow-structured second plunger that configures a lower part of the probe pin separately from the first plunger, and has a bottom at an end on a side opposite to the first plunger;

(iii) a cleaning shaft that is accommodated in the inside of the first plunger, and partially projects from a tip of the contact;

(iv) a first coil spring that is wound on an outer side face of the first plunger and on an outer side face of the second plunger, and electrically couples the first plunger to the second plunger; and (v) a second coil spring that is accommodated in the inside of the first plunger and in the inside of the second plunger while being held between the cleaning shaft and the bottom of the second plunger, in which, when part of the cleaning shaft enters and exits through the tip of the contact, a foreign substance attached to the tip of the contact is removed.

Supplementary Note 2

In the method according to supplementary note 1, when the electrode pad is not in contact with the probe pin, part of the cleaning shaft projects from the tip of the contact.

Supplementary Note 3

In the method according to supplementary note 1, when the electrode pad is not in contact with the probe pin, part of the cleaning shaft projects from the tip of the contact, and when the part of the cleaning shaft projecting from the tip of the contact is pushed into the inside of the first plunger from the tip of the contact, the part of the cleaning shaft comes into contact with an inner side face of the contact.

Supplementary Note 4

In the method according to supplementary note 1, when the electrode pad is electrically coupled to the probe pin, the cleaning shaft does not project from the tip of the contact.

Supplementary Note 5

In the method according to supplementary note 1, first spring pressure of the first coil spring is higher than second spring pressure of the second coil spring.

Supplementary Note 6

In the method according to supplementary note 1, the second coil spring is not fixed to the cleaning shaft and to the bottom of the second plunger.

Supplementary Note 7

In the method according to supplementary note 1, a gap of 4 to 6 μm is provided between an inner side face of the first plunger and an outer side face of the cleaning shaft.

Supplementary Note 8

In the method according to supplementary note 1, the first plunger, the second plunger, and the first coil spring each include a conductive material, and the cleaning shaft includes a conductive material or an insulating material.

Supplementary Note 9

In the method according to supplementary note 1, the first plunger includes gold-plated stainless steel or a platinum alloy, and the cleaning shaft includes stainless steel.

Supplementary Note 10

In the method according to supplementary note 1, the contact of the first plunger has a tip having a split shape, and each of apexes of the tip has an acute angle.

Supplementary Note 11

In the method according to supplementary note 1, projections and depressions are alternately and repeatedly provided on an outer side face of the cleaning shaft in a direction in which the probe pin is pushed.

Supplementary Note 12

In the method according to supplementary note 1, a plurality of abrasive particles are embedded in an outer side face of the cleaning shaft.

What is claimed is:

1. A method of manufacturing a semiconductor device, comprising the steps of:

(a) providing a semiconductor device having semiconductor chips each having a semiconductor integrated circuit, and a plurality of outer terminals that are each electrically coupled to the semiconductor integrated circuit; and (b) bringing a probe pin into contact with each of the outer terminals to measure electrical properties of the semiconductor integrated circuit, the probe pin including:

(i) a hollow-structured first plunger that configures an upper part of the probe pin and has a contact that comes into contact with the outer terminal;

(ii) a hollow-structured second plunger that configures a lower part of the probe pin separately from the first plunger, and has a bottom at an end on a side opposite to the first plunger;

(iii) a cleaning shaft that is accommodated in the inside of the first plunger, and partially projects from a tip of the contact;

(iv) a first coil spring that is wound on an outer side face of the first plunger and on an outer side face of the second plunger, and electrically couples the first plunger to the second plunger; and (v) a second coil spring that is accommodated in the inside of the first plunger and in the inside of the second plunger while being held between the cleaning shaft and the bottom of the second plunger, wherein when part of the cleaning shaft enters and exits through the tip of the contact, a foreign substance attached to the tip of the contact is removed.

2. The method according to claim 1, wherein when the outer terminal is not in contact with the probe pin, part of the cleaning shaft projects from the tip of the contact.

3. The method according to claim 1, wherein when the outer terminal is not in contact with the probe pin, part of the cleaning shaft projects from the tip of the contact, and wherein when the part of the cleaning shaft projecting from the tip of the contact is pushed into the inside of the first plunger from the tip of the contact, the part of the cleaning shaft comes into contact with an inner side face of the contact.

4. The method according to claim 1, wherein when the outer terminal is electrically coupled to the probe pin, the cleaning shaft does not project from the tip of the contact.

5. The method according to claim 1, the step (b) further comprising the steps of:

(b1) providing a measurement socket having the probe pins each having the cleaning shaft that partially projects from the tip of the contact, and inserting the semiconductor device into the measurement socket while the respective outer terminals are opposed to the probe pins;

(b2) pressing the semiconductor device to bring each of the outer terminals into contact with the cleaning shaft projecting from the tip of the contact;

(b3) pressing the semiconductor device to compress the second coil spring, thereby pushing part of the cleaning shaft projecting from the tip of the contact into the first plunger;

(b4) pressing the semiconductor device to compress the first coil spring and the second coil spring, thereby electrically coupling the outer terminal to the tip of the contact to measure electrical properties of the semiconductor device; and (b5) stopping press of the semiconductor device to separate the outer terminal from the tip of the contact, and thus releasing compression of the first coil spring and the second coil spring to allow the part of the cleaning shaft to project from the tip of the contact.

6. The method according to claim 5, wherein in the step (b3), a foreign substance attached to the tip of the contact is removed.

7. The method according to claim 1, wherein first spring pressure of the first coil spring is higher than second spring pressure of the second coil spring.

8. The method according to claim 1, wherein the second coil spring is not fixed to the cleaning shaft and to the bottom of the second plunger.

9. The method according to claim 1, wherein a gap of 4 to 6 µm is provided between an inner side face of the first plunger and an outer side face of the cleaning shaft.

10. The method according to claim 1, wherein the first plunger, the second plunger, and the first coil spring each include a conductive material, and the cleaning shaft includes one of a conductive material and an insulating material.

11. The method according to claim 1, wherein the first plunger includes one of gold-plated stainless steel and a platinum alloy, and the cleaning shaft includes stainless steel.

12. The method according to claim 1, wherein the contact of the first plunger has a tip having a split shape, and each of apexes of the tip has an acute angle.

13. The method according to claim 1, wherein the contact of the first plunger has a conical tip depressed in a direction in which the probe pin is pushed.

14. The method according to claim 1, wherein projections and depressions are alternately and repeatedly provided on an outer side face of the cleaning shaft in a direction in which the probe pin is pushed.

15. The method according to claim 1, wherein a plurality of abrasive particles are embedded in an outer side face of the cleaning shaft.

* * * * *